(12) United States Patent
Martino

(10) Patent No.: US 10,312,710 B1
(45) Date of Patent: Jun. 4, 2019

(54) ENERGY RECOVERY PULSE FORMING NETWORK

(71) Applicant: The United States of America, as represented by the Secretary of the Navy, Washington, DC (US)

(72) Inventor: Christopher Adrian Martino, Arnold, MD (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 303 days.

(21) Appl. No.: 15/463,135

(22) Filed: Mar. 20, 2017

Related U.S. Application Data

(60) Provisional application No. 62/452,827, filed on Jan. 31, 2017.

(51) Int. Cl.
*F41B 6/00* (2006.01)
*H02J 7/00* (2006.01)
*H02J 7/34* (2006.01)

(52) U.S. Cl.
CPC .............. *H02J 7/007* (2013.01); *F41B 6/006* (2013.01); *H02J 7/0068* (2013.01); *H02J 7/345* (2013.01)

(58) Field of Classification Search
USPC ......................................................... 307/12
See application file for complete search history.

(56) References Cited

U.S. PATENT DOCUMENTS

| | | | |
|---|---|---|---|
| 4,343,223 A | 8/1982 | Hawke et al. | |
| 4,753,153 A | 6/1988 | Jasper, Jr. | |
| 4,885,974 A * | 12/1989 | Honig | F41B 6/006 89/8 |
| 5,375,504 A | 12/1994 | Bauer | |
| 7,675,198 B1 * | 3/2010 | Maier, II | F41B 6/006 307/106 |
| 7,781,918 B2 | 8/2010 | Crane | |
| 8,018,096 B1 | 9/2011 | Maier, II | |
| 8,450,985 B2 | 5/2013 | Gray et al. | |

OTHER PUBLICATIONS

Boora, Arash A., F. Zare, G. Ledwich, A. Ghosh, "A General Approach to Control a Positive Buck-Boost Converter to Achieve Robustness against Input Voltage Fluctuations and Load Changes," Power Electronics Specialists conference (PESC), 2008, IEEE, pp. 2011-2017.

* cited by examiner

*Primary Examiner* — Rexford N Barnie
*Assistant Examiner* — Xuan Ly
(74) *Attorney, Agent, or Firm* — Naval Postgraduate School; Lisa A. Norris

(57) ABSTRACT

An energy recovery pulse forming network and method that recovers at least a portion of the energy in a railgun by transferring energy dissipated from the railgun inductance back to an initial source of the energy, such as an input capacitor, for use by the network. This reduces the amount of energy required from an external power source to charge the input capacitor during subsequent railgun firings.

16 Claims, 24 Drawing Sheets

ENERGY RECOVERY PULSE FORMING NETWORK

CROSS-REFERENCE TO RELATED APPLICATIONS

This application claims the benefit of U.S. Provisional Application No. 62/452,827, filed Jan. 31, 2017, which is hereby incorporated in its entirety by reference.

BACKGROUND OF THE INVENTION

1. Field of the Invention

The present invention relates generally to pulse forming networks. More particularly, the present invention relates to electrical circuits used in electromagnetic launchers, such as railguns.

2. Description of the Related Art

Electromagnetic launchers, such as railguns, require extremely high power and energy for each current pulse delivered by a power supply in order to support the firing of the load. The basic physical phenomenon that drives a railgun is the Lorentz force. In a railgun electrical current supplied by the power source, such as a pulse forming network (PFN), is conducted through two metal rails electrically coupled by a conductive armature, such as a conductive projectile, across the rails. The current is conducted through one rail of the railgun, through the armature, and back to the source through the other rail. The current flowing through the rails and the armature generates a magnetic field around each rail. The magnetic field acts on the electric current flowing through the armature and the resulting Lorentz force accelerates the armature along the rails and out of the muzzle end of the railgun barrel. The patent art includes examples of a pulse forming networks for high current, high power applications such as a railgun. One such example is U.S. Pat. No. 7,675,198 B1 to William Bryan Maier II.

As earlier described, the current flowing through one rail generates a magnetic flux density the same way current flowing in a wire generates a magnetic flux density. The magnetic flux density B is found from the current through a surface using Ampere's circuital law. The integral and differential forms for this law are $$\oint B \cdot dl = \mu_0 I_{enc} \quad (1)$$

$$\nabla \times B = \mu_0 J$$

where dl is a line element of the closed curve C, $\mu_0$ is the magnetic constant or permeability of free space ($4\pi \times 10^{-7}$ T m/A), $I_{enc}$ is the total current passing through a surface S enclosed by the closed curve C, $\nabla \times$ is the curl operator, and J is the current density through S. The magnetic flux density generated by a wire is found from this to be $$B = \frac{\mu I}{2\pi r} \quad (2)$$

where r is the distance of the measurement point from the wire, I is the current in the wire, and $\mu$ is the permeability of the medium surrounding the wire.

The Lorentz force is developed from the action of the combined magnetic flux densities from the two rails upon the armature. The continuous analogue of the Lorentz force equation is $$f = \rho E + J \times B \quad (3)$$

where f is the force density (force per unit volume), $\rho$ is the charge density, E is the electric field exerted on that charge density, and J is the current density. The magnetic flux density that is generated by the current flowing in the two rails interacts with the current in the armature simplifying the Lorentz force equation to $$F = I \int dl \times B \quad (4)$$

where I is the current in the wire (armature) and dl is a differential length of the wire aligned with the direction of the current flow. This force continues as long as there is a current in the armature and there is magnetic flux density acting in a direction perpendicular to the flow of the current in the armature.

From equation (2) and equation (4), the force on the armature is related to the current through the rails and armature and a constant as $$F = \left(\frac{\mu I^2}{2\pi}\right) \ln\left(1 + \frac{w}{R}\right) = \frac{L_{prime} I^2}{2} \quad (5)$$

where $L_{prime}$ is the inductance gradient of the rail, w is the distance between the rails, and R is the radius of the circular rails. A similar relationship between the force on the armature and the current can be developed using Ampere's law with the rails assumed to be flat plates. The result of these calculations is $$a = \frac{dv}{dt} = \frac{L_{prime} I^2}{2m} \quad (6)$$

where a is the acceleration of the armature, v is the velocity of the armature, t is time, and m is the mass of the armature.

For the circuit to remain completed until the projectile is launched, the armature needs to remain in contact with the rails. The armature needs to be able to move in order to gain velocity up to the desired level with the force applied. At the same time, the armature needs to maintain a low-voltage electrical contact with the rails for the current to flow through. Currently in some railgun systems, this low-voltage electrical contact is maintained by melting aluminum from the armature. The initial flow of current through the rails and armature runs through the interface between the rails and the aluminum armature, which results in heating at the contact and the melting of the aluminum. The armature is under compression in the rails and in some systems is shaped to help maintain contact as the armature melts. The armature is shaped to face toward the breech of the rail to encourage the contacts to expand outward in response to Lorentz forces. This need to melt the aluminum armature at the start of a shot means that a large current is demanded early, even before the armature can begin to move effectively.

Generally viewed, there are four equations that describe and limit the operation of railguns. The first equation describes the energy dissipated $W_d$ as heat in the rails and power source when a projectile of mass m is accelerated to velocity v as $$W_d \geq \left(\frac{2mR}{L_{prime}}\right)v = \left(\frac{2R}{L_{prime}}\right)\sqrt{2mW_p} \quad (7)$$

where R is the effective electrical resistance of the circuit and $W_p$ is the projectile energy. The second equation is that the maximum velocity for the projectile leaving the rail becomes $$v = -\frac{2R}{L_{prime}} + \sqrt{\frac{2W_0}{m} + \left(\frac{2R}{L_{prime}}\right)^2} \quad (8)$$

where $W_0$ is the initial energy stored in the power supply. The third equation describes the efficiency f of energy transfer to the projectile as $$f \leq \frac{x \cdot L_{prime}}{(L + x \cdot L_{prime})} \quad (9)$$

where x is the distance travelled by the armature in the rails and L is the inductance between the power source and the rails. The last equation is $$f \leq \frac{x \cdot L_{prime}}{L + 2x \cdot L_{prime} + \left(\frac{4Rx}{v}\right)} \quad (10)$$

which completes the conclusion that the railgun performs best when $W_0$ and $L_{prime}$ are large and R and L are small.

One current limitation is the practical limit to the velocity of the projectile imposed by the atmosphere. Solid masses moving through the atmosphere heat up due to the frictional resistance of the air. In some systems, even with aerodynamic design of the projectile, this heating and energy loss becomes excessive once the projectile exceeds speeds of 2500 m/s. Above this velocity, the projectile melts. Therefore, in some systems, the projectile only needs to be accelerated to 2500 m/s before leaving the rails.

Another limitation is imposed by the guidance of the projectile. Due to the vector nature of the magnetic flux density, the conductive rails need to be kept straight to maximize the force imparted to the projectile. This means that the projectile cannot be spin stabilized as it moves through the rails. Without spin stabilization, the delivery of the projectile will be highly inaccurate. To mitigate this limitation, in some systems, guidance systems are included in the projectile to ensure it accurately impacts the target. Unfortunately, these guidance systems have a limit on how rapidly they can change acceleration (known as jerk) and on how quickly they can accelerate. In some systems, the limit on acceleration is approximately 45 kgee, or 440 km/s². Because the force on the armature and projectile is proportional to the current in the rail, these requirements place a limit on how quickly the current in the rail can rise and a maximum on the amount of current in the rail. Thus as an example, from equation (6), the maximum current is approximately 2 MA for a 3 kg armature with a reasonable $L_{prime}$ of 500 nH/m.

Taking as an example a 3 kg projectile and a muzzle velocity of 2.5 km/s, the energy of the projectile at the muzzle is approximately 9 MJ. In order to give the projectile that much energy at the muzzle, approximately double that energy has to be applied to the rails, or 20 MJ. The rest of the energy is stored in the magnetic flux density generated by the rails and against which the armature is pushing. The capacitive storage elements that are discharged to create the current pulse require two to three times as much energy as the energy at the input to the rails due to circuit losses. The capacitive storage elements discharge approximately 100 MJ of energy during the time the armature is moving in the rails, of which approximately 10 MJ is sent out the rail as kinetic energy in the projectile. The rest of the energy turns into heat in the circuit and the rails.

Time requirements translate these energy requirements into power. As an example, for a linear acceleration of the projectile due to a constant current of 2 MA, the armature will be in the rails with current applied for approximately 6 ms. The rail would demand approximately 17 GW of power during the rail firing. This cannot be provided by some current standard power supplies on ships on an instantaneous basis, so an energy storage system is required. If, for example, a rate of fire desired is approximately 6 to 12 rounds per minute, or one firing transient every 83 ms, this lowers the power requirement to 1.2 GW, which is still too high for some systems. Therefore, the proposed rate of fire will not be able to be maintained for a long time and will be based on the amount of energy storage provided to support the railgun system.

SUMMARY OF THE INVENTION

Embodiments in accordance with the invention include an energy recovery pulse forming network and method that recover at least a portion of the energy in a railgun by transferring energy dissipated from the railgun inductance back to an initial source of the energy, such as an input capacitor, for use by the powering circuit. This in turn reduces the amount of energy required from a power source to charge the input capacitor during subsequent railgun firings.

Embodiments in accordance with the invention are best understood by reference to the following detailed description when read in conjunction with the accompanying drawings

BRIEF DESCRIPTION OF THE DRAWINGS

FIG. 18 shown in partial views

Embodiments in accordance with the invention are further described herein with reference to the drawings.

DETAILED DESCRIPTION OF THE INVENTION

Figure 1:
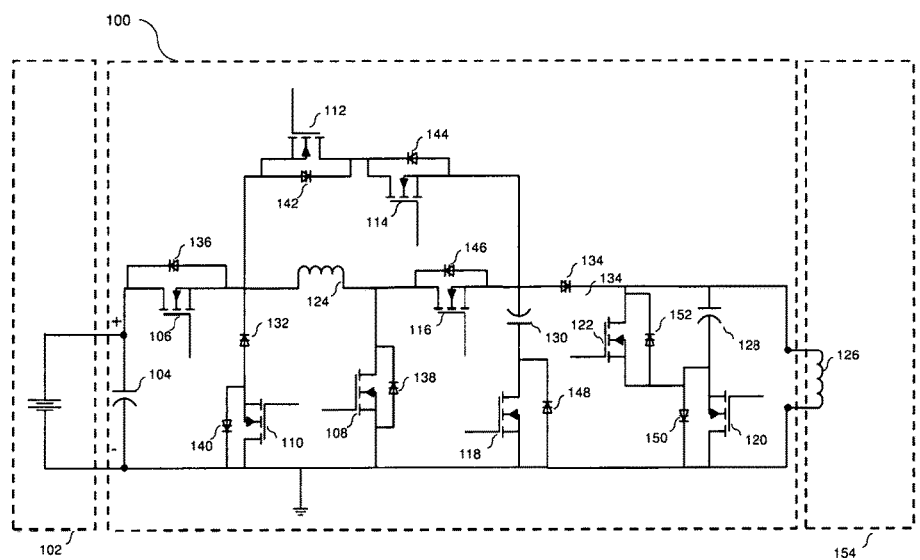
FIG. 1 illustrates a circuit diagram of an energy recovery pulse forming network in accordance with one embodiment of the invention.

FIG. 1 illustrates an energy recovery pulse forming network 100 conductively coupled with a power supply 102 and a railgun 154 in accordance with one embodiment of the invention. In one embodiment, energy recovery pulse forming network 100 is implemented with railgun 154 to serve a load of railgun 154 and to return at least some of the energy stored in the magnetic field in the rails of railgun 154 back to the input capacitor(s) for reuse during the next transient of railgun 154.

In one embodiment, railgun 154 includes a pair of parallel conductive rails electrically coupled with energy recovery pulse forming network 100, herein also termed network 100. Network 100 is further electrically coupled with and powered by electrical power supply 102, such as a high voltage DC power supply. When a conductive armature is inserted between the rails, network 100 is completed. In one embodiment, the armature is a sliding armature used to launch a projectile out a muzzle end of railgun 154. As earlier described, the armature is accelerated by the electromagnetic effects of a current that flows down one rail into the armature and then back along the other rail. The electromagnetic effects move the armature and projectile down the rails and launch the armature and projectile out the muzzle end of railgun 100. In various embodiments, the armature can be integrated with the projectile or formed separate from the projectile.

Broadly viewed, energy recovery pulse forming network 100 includes positive buck-boost converter circuitry modified with additional circuit elements arranged to return energy stored in the load inductance to one or more input capacitors. A portion of the energy delivered to the railgun load is directed into creating a magnetic field that the current moving through the armature of railgun 154 is pushing against. This energy remains in the rail inductance, i.e., the load inductance, when the projectile, moved along by the armature, leaves the rails. The energy in the rail inductance is dissipated as heat in the rails and the supply circuitry. In accordance with one embodiment of the invention, at least a portion of this energy is recovered by driving the current in the railgun close to zero when the armature leaves the rails. In order to reduce the current in the railgun load to zero, a voltage is applied to the load inductor that is counter to the voltage provided by the pulse power supply before the armature leaves the rails. Energy recovery pulse forming network 100 provides this voltage, stores the energy from the current in the load inductor, and returns at least a portion of that energy to the input capacitor(s).

Referring now to FIG. 1, energy recovery pulse forming network 100 includes an input capacitor 104 electrically connectable to power supply 102 that powers input capacitor 104. Input capacitor 104 is electrically connectable to an output load represented as an inductive load, such as the rails of railgun 154, and shown as a load inductor 126. In the present embodiment, energy recovery pulse forming network 100 further includes a first switch 106 (S1), a second switch 108 (S2), a third switch 110 (S3), a fourth switch 112 (S4), a fifth switch 114 (S5), a sixth switch 116 (S6/supply switch), a seventh switch 118 (S7), an eighth switch 120 (S8), a ninth switch 122 (S9), a supply inductor 124, a load capacitor 128, a recovery capacitor 130, a first diode 132 (D1), and a second diode 134 (D2).

A third diode 136 is electrically coupled in parallel with first switch 106 (S1). A fourth diode 138 is electrically coupled in parallel with second switch 108 (S2). A fifth diode 140 is coupled in parallel with third switch 110 (S3). A sixth diode 142 is coupled in parallel with fourth switch 112 (S4). A seventh diode 144 is coupled in parallel with fifth switch 114 (S5). An eighth diode 146 is coupled in parallel with sixth switch 116 (S6). A ninth diode 148 is coupled in parallel with seventh switch 118 (S7). A tenth diode 150 is coupled in parallel with eighth switch 120 (S8). An eleventh diode 152 is coupled in parallel with ninth switch 122 (S9).

In some embodiments, switches 106, 108, 110, 112, 114, 116, 118, 120, and 122 can be implemented as semiconductor devices, such as metal-oxide-semiconductor field-effect transistors (MOSFETs), for example SiC MOSFETs, each having a gate, drain and source. Each gate can be controlled by a respective gate drive circuit. Each gate drive circuit can be controlled by a controller via a respective control line to effect the closing or opening of the switch. In one embodiment respective diodes 136, 138, 140, 142, 144, 146, 148, 150, and 152, which are electrically coupled in parallel with respective switches 106, 108, 110, 112, 114, 116, 118, 120, and 122, may be internal to each MOSFET switch and formed of the semiconductor body of the MOSFET. In other embodiments, the diodes may be externally electrically coupled to the MOSFET switches. In some embodiments, a turn-off snubber can be included across each of switches 106, 108, 110, 112, 114, 116, 118, 120, and 122 to minimize the turn-off transients on the components.

In one embodiment, each gate is driven by a respective isolated gate driver with independent power supply (not shown). The voltages and currents for the gate drivers are dependent on the switches used. For example, in one embodiment, first switch 106 (S1) and fourth switch 112 (S4) are connected to a first isolated power supply; second switch 108 (S2) and seventh switch 118 (S7) are connected to a second isolated power supply; third switch 110 (S3) is connected to a third isolated power supply; fifth switch 114 (S5) and sixth switch 116 (S6) are connected to a fourth isolated power supply; and eighth switch 120 (S8) and ninth switch 122 (S9) are connected to a fifth isolated power supply. As can be appreciated by those of skill in the art, the arrangement and connections to isolated gate drivers and respective power supplies can vary, and the above example is not meant to be limiting on the invention. In one embodiment, the isolated gate drivers are optoisolated gate drivers arranged in a totem pole arrangement for +15 V, 0 V, and −15 V potentials to drive the gates.

Figure 21:
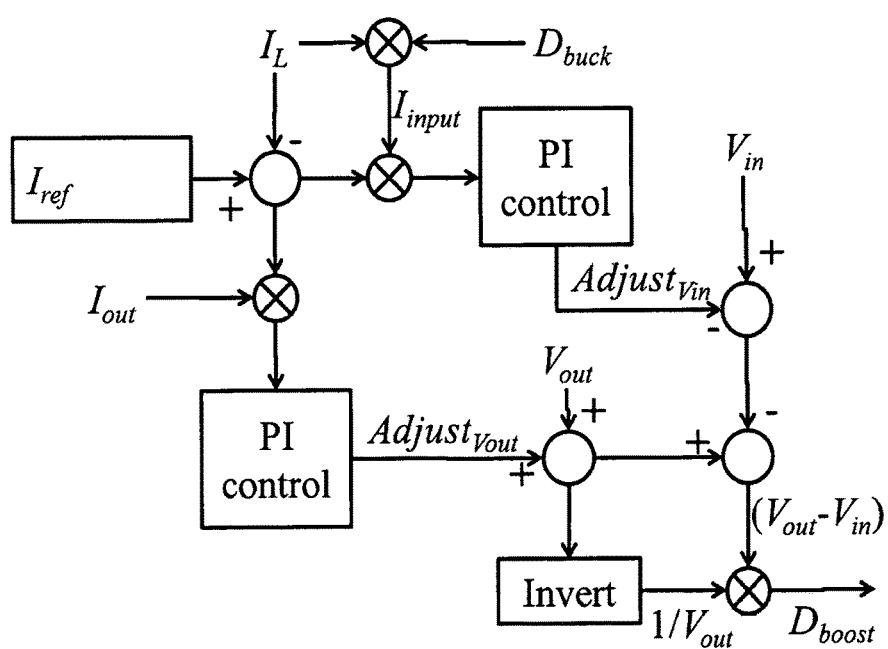
FIG. 21 illustrates a control block diagram of a $D_{boost}$ controller in accordance with one embodiment of the invention.

Referring now to FIG. 1 and FIG. 21 together, in one embodiment, the isolated power supplies to switches 106, 108, 110, 112, 114, 116, 118, 120, and 122 can be electrically coupled to a controller 1900 and controlled by controller 1900. Controller 1900 may include a processor 1902, e.g., a central processing unit (CPU), and a memory device 1904. Memory device 1904 may include one or more memories and can include computer-readable storage media or memories having instructions for activating the switches in network 100 (via the power supplies) in accordance with a method, such as a method 1800, to allow the return of energy stored in the load inductance to input capacitor 104 as further described herein. Controller 1900 may further include a logic circuit or other device capable of controlling the switches. Controller 1900 can be electrically coupled to each power supply via a respective control line 1906 and can provide control signals to each power supply via the respective control line 1906 to effect the closing or opening of the respective switch(es). In one embodiment, control lines 1906 are communicatively coupled to network 100 via one or more interfaces 1910.

In one embodiment, controller 1900 can monitor currents and voltages in network 100 via one or more sensor lines 1908 attached to one or more sensors (not shown) that are connected at various points to network 100 and which supply network sensor data. Controller 1900 can activate the switch settings via the power supplies in accordance with the instructions of method 1800 and the sensor inputs. In one embodiment, sensor lines 1908 are communicatively coupled to controller 1900 via one or more interfaces 1910. In one embodiment, the switch settings are activated in network 100 (via the power supplies) to allow the return of energy stored in the load inductance to the input capacitor 104 as described herein. In one embodiment, controller 1900 receives sensor inputs on the input voltage (Vin) at input capacitor 104, the output voltage (Vout) across railgun 154, the voltage of recovery capacitor 130, the voltage across supply inductor 124, the current from input capacitor 104 into first switch 106, the current provided by network 100 to inductor 126, and the current in supply inductor 124. In one embodiment, controller 1900 also monitors armature position and current in railgun 154 via railgun sensor lines 1912 attached to one or more railgun sensors (not shown) that are connected at one or more locations to railgun 154 and which provide railgun sensor data. In one embodiment, controller 1900 receives railgun sensor data on the position of the armature in the rails of railgun 154, such as via a position sensor, and on the current in railgun 154. In some embodiments, the current in railgun 154 may not equal the current provided by network 100 due to multiple supplies in the form of network 100 providing current to the same railgun 154. In one embodiment, railgun sensor lines 1912 are communicatively connected to controller 1900 via one or more interfaces 1910. In one embodiment, controller 1900 also receives operator control signals input by a railgun operator via operator control lines 1914. In one embodiment, operator control lines 1914 are communicatively coupled to controller 1900 via one or more interfaces 1910. In some embodiments, controller 1900 may also be communicatively coupled to power source 102 via source control lines (not shown) to provide control signals to power source 102.

FIGS. 2-17 illustrate circuit diagrams showing the operation of network 100 in recovery of energy in a pulse forming network supporting a railgun load 126 in accordance with one embodiment of the invention. In FIGS. 2-17 closure of a switch is indicated by a slash mark across the switch.

Figure 2:
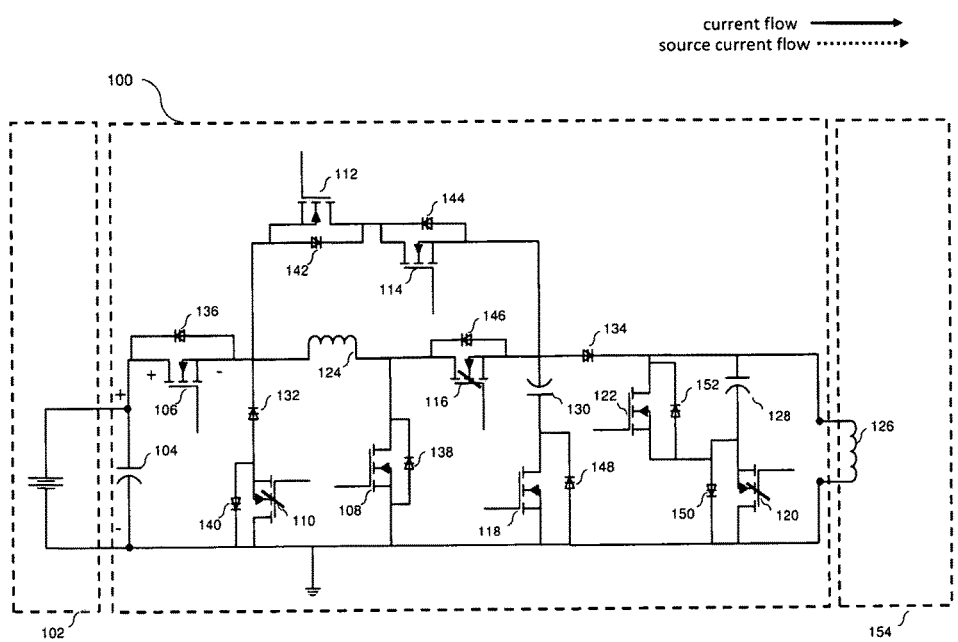
FIG. 2 illustrates a circuit diagram of the network of FIG. 1 with the input capacitor charged and ready to begin a pulse to fire an armature loaded in a railgun in accordance with one embodiment of the invention.

Referring now to FIG. 2, FIG. 2 illustrates network 100 with input capacitor 104 charged from power source 102 and ready to begin a pulse to fire an armature loaded in railgun 154 in accordance with one embodiment of the invention. In some firings, the armature may be loaded with a projectile, while in other firings, the armature may be formed with the projectile. As earlier described, the railgun load is represented in the circuit diagrams as load inductor 126.

As illustrated, the initial switch settings of network 100 are first switch 106 (S1) open, second switch 108 (S2) open, third switch 110 (S3) closed, fourth switch 112 (S4) open, fifth switch 114 (S5) open, sixth switch 116 (S6) closed, seventh switch 118 (S7) open, eighth switch 120 (S8) closed, and ninth switch 122 (S9) open.

Figure 3:
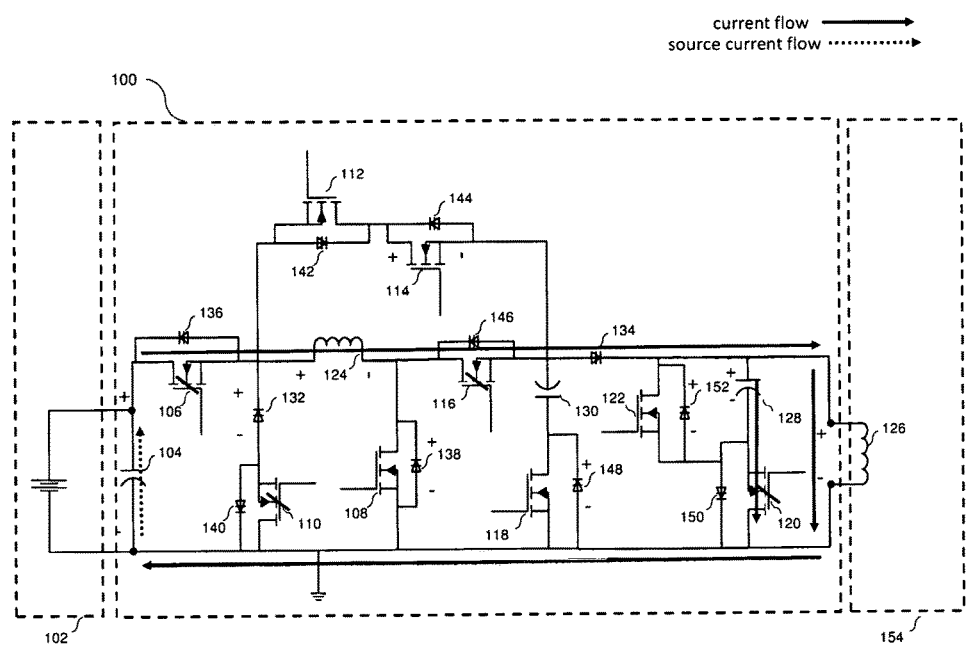
FIG. 3 illustrates a circuit diagram of the network of FIG. 1 with buck charging of the supply inductor in accordance with one embodiment of the invention.

FIG. 3 illustrates a circuit diagram of network 100 in which supply inductor 124 is buck charged. To initiate the buck charging of the supply inductor 124, first switch 106 (S1) is closed, for example, in response to an operator control signal to launch and the pulse to fire the armature initiated. Input capacitor 104 discharges into supply inductor 124, load inductor 126, and load capacitor 128. The current flows from input capacitor 104 through first switch 106 (S1), which is closed, through sixth switch 116 (S6), which is closed, through second diode 134 (D2), which is forward biased, and through eighth switch 120 (S8), which is closed.

Figure 4:
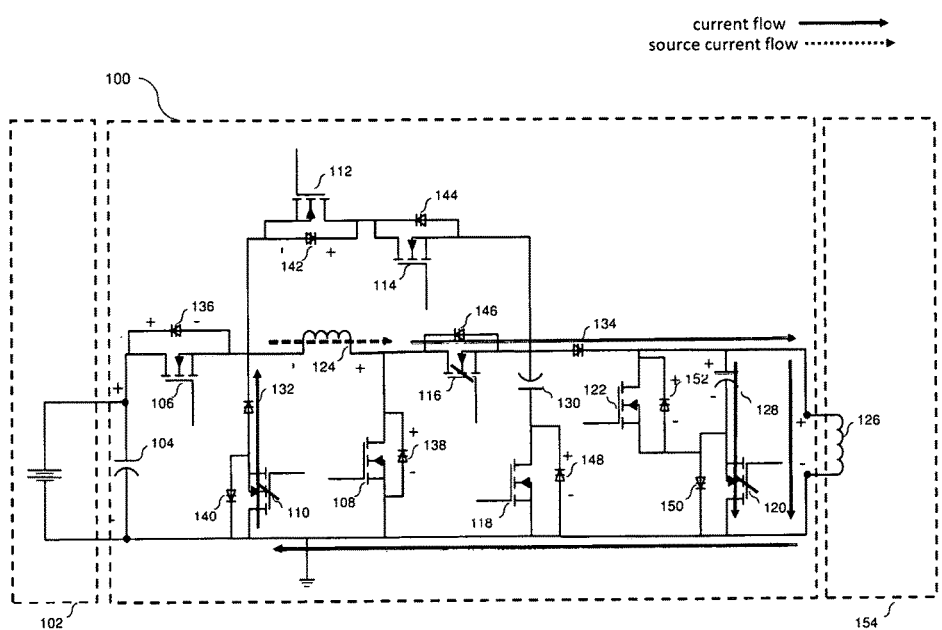
FIG. 4 illustrates a circuit diagram of the network of FIG. 1 with buck discharging of the supply inductor in accordance with one embodiment of the invention.

FIG. 4 illustrates a circuit diagram of network 100 in which supply inductor 124 is buck discharged. To initiate the discharge from supply inductor 124, first switch 106 (S1) is opened. Supply inductor 124 discharges into load inductor 126 and load capacitor 128. The current flows through third switch 110 (S3), which is closed, through first diode 132 (D1), which is forward biased, through sixth switch 116 (S6), which is closed, through second diode 134 (D2), which is forward biased, and through eighth switch 120 (S8), which is closed.

In the present embodiment, network 100 alternates between the states of FIGS. 3 and 4 by opening and closing first switch 106 (S1) in a sequence controlled by the logic in controller 1900 to ensure the current in railgun 154 climbs to a specified current level and remains there. Control of the current in railgun 154 is possible by alternating between the states of FIGS. 3 and 4 until the voltage at input capacitor 104 (Vin) is equal to the voltage across load inductor 126. When the voltage at load inductor 126 is greater than the voltage at input capacitor 104, the state of first switch 106 (S1) is left closed. The control of the current provided by network 100 is then implemented by boost charging of supply inductor 124 through the opening and closing of second switch 108 (S2) as next described with reference to FIG. 5.

Figure 5:
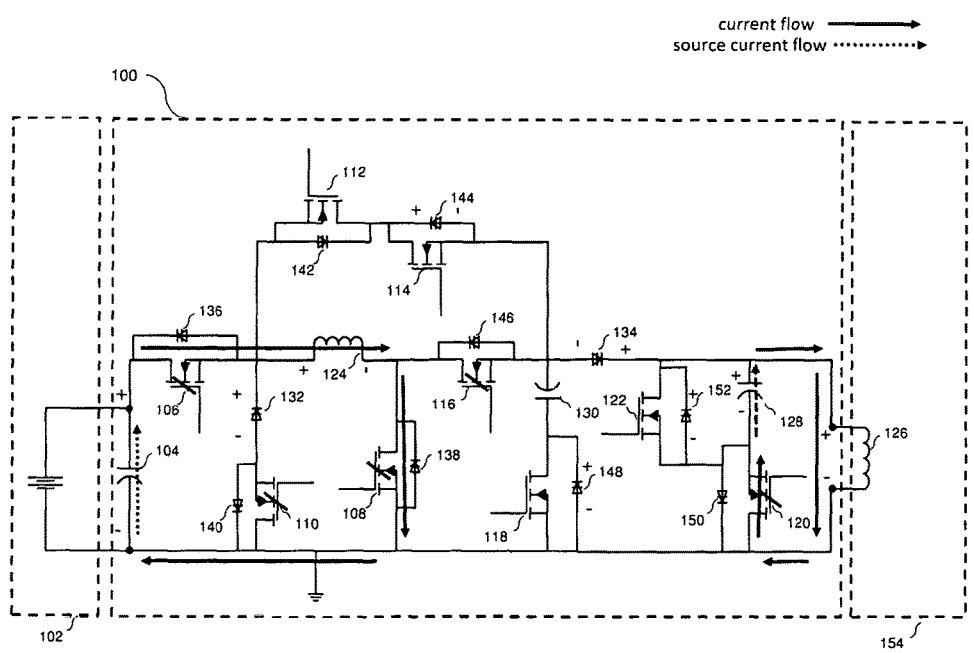
FIG. 5 illustrates a circuit diagram of the network of FIG. 1 with boost charging of the supply inductor in accordance with one embodiment of the invention.

FIG. 5 illustrates a circuit diagram of network 100 in which supply inductor 124 is boost charged. This state is initiated when the current provided by network 100 can no longer be controlled by changing the state of first switch 106 (S1). To initiate the boost charging of supply inductor 124, second switch 108 (S2) is closed. Input capacitor 104 discharges into supply inductor 124. The current flows through first switch 106 (S1), which is closed, and through second switch 108 (S2), which is closed. Load capacitor 128 discharges into load inductor 126 with the current flowing through eighth switch 120 (S8), which is closed.

Figure 6:
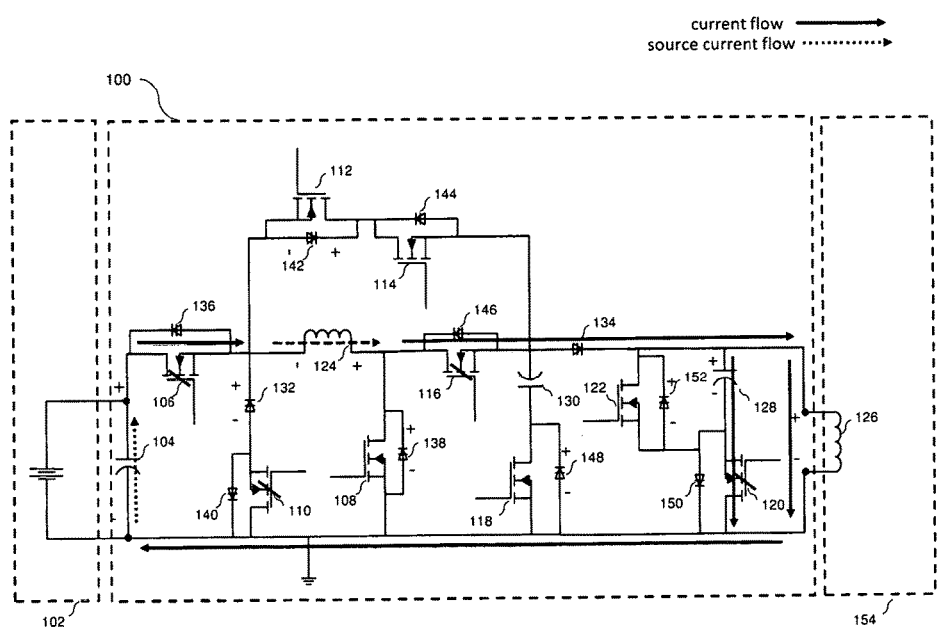
FIG. 6 illustrates a circuit diagram of the network of FIG. 1 with boost discharging of the supply inductor in accordance with one embodiment of the invention.

FIG. 6 illustrates a circuit diagram of network 100 in which supply inductor 124 is boost discharged. To initiate boost discharging of supply inductor 124, second switch 108 (S2) is opened. Input capacitor 104 and supply inductor 124 discharge into load inductor 126 and load capacitor 128. The current flows through first switch 106 (S1), which is closed, and through first diode 132 (D1), which is forward biased, through sixth switch 116 (S6), which is closed, through second diode 134 (D2), which is forward biased, and through eighth switch 120 (S8), which is closed.

In the present embodiment, network 100 alternates between the states of FIGS. 5 and 6 by opening and closing second switch 108 (S2) in a sequence controlled by the logic in controller 1900 to ensure the current in supply inductor 124 remains at a specified level. In the present embodiment, network 100 alternates between the states of FIGS. 5 and 6 until the input voltage (Vin) at input capacitor 104 drops below a specified minimum voltage value, or when the armature has moved past a specified location in the rails(s) of railgun 154 such that recovery of energy from load inductor 126 can be initiated. In one embodiment, the specified minimum voltage value is one percent (1%) of the initial input voltage. In one embodiment, the specified location in the rail(s) of railgun 154 is eighty percent (80%) of the rail length. In one embodiment, the voltage can be determined by a voltage sensor connected to network 100, and the location of the armature can be determined by a position sensor, such as a contact switch or image sensor device, attached to or in proximity of railgun. The voltage and/or location information is then communicated to controller 1900 via one or more sensor lines 1908, 1912, respectively.

Dropping the current to zero (0) amperes (A) in the rails may cause undesirable outcomes; for example, the armature may stop in the rail and not clear the rail because there is insufficient heat in the armature to melt the aluminum contacts and allow the armature to slide on the melted interface. Thus in one embodiment allowing a minimum current in the rails at the end of the shot of the projectile should avoid undesirable outcomes. With a minimal current in the rails when the armature leaves the rails, there should only be a small arc created as the rail circuit is broken. Seventh switch 118 (S7) is oriented in network 100 to prevent recovery capacitor 130 from discharging its stored energy into the load, e.g., the rails, when the arc is created.

Figure 7:
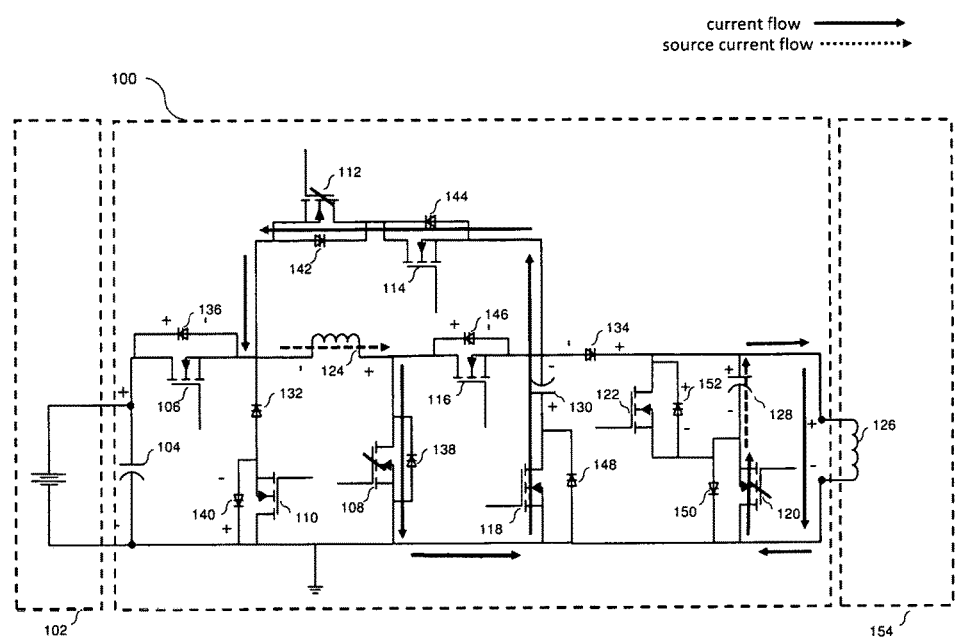
FIG. 7 illustrates a circuit diagram of the network of FIG. 1 with initiation of energy recovery in accordance with one embodiment of the invention.

FIG. 7 illustrates a circuit diagram of network 100 in which recovery of energy is initiated. The energy stored in supply inductor 124 discharges to recovery capacitor 130 and load capacitor 128 discharges to load inductor 126. In one embodiment, this state is initiated so that when the current in load inductor 126 reaches zero amperes, the armature is at the end of the rails or has cleared the end of the rails.

The recovery process is initiated when first switch 106 (S1), third switch 110 (S3), and sixth switch 116 (S6) are opened, and fourth switch 112 (S4) and second switch 108 (S2) are closed. In some embodiments, third switch 110 (S3) can be opened while alternating between the states of FIGS. 5 and 6. This can take place because no current should flow through first diode 132 (D1) in either of these states whether third switch 110 (S3) is open or closed. Third switch 110 (S3) must be opened before sixth switch 116 (S6) is opened to ensure that supply inductor 124 current does not flow through second switch 108 (S2) and returns to supply inductor 124 through first diode 132 (D1). The current path is through second switch 108 (S2), which is closed, through seventh switch 118 (S7), which is forward biased, through fifth switch 114 (S5), which is forward biased, and through fourth switch 112 (S4), which is closed. When sixth switch 116 (S6) is opened, load capacitor 128 is discharged into load inductor 126 through eighth switch 120 (S8).

Figure 8:
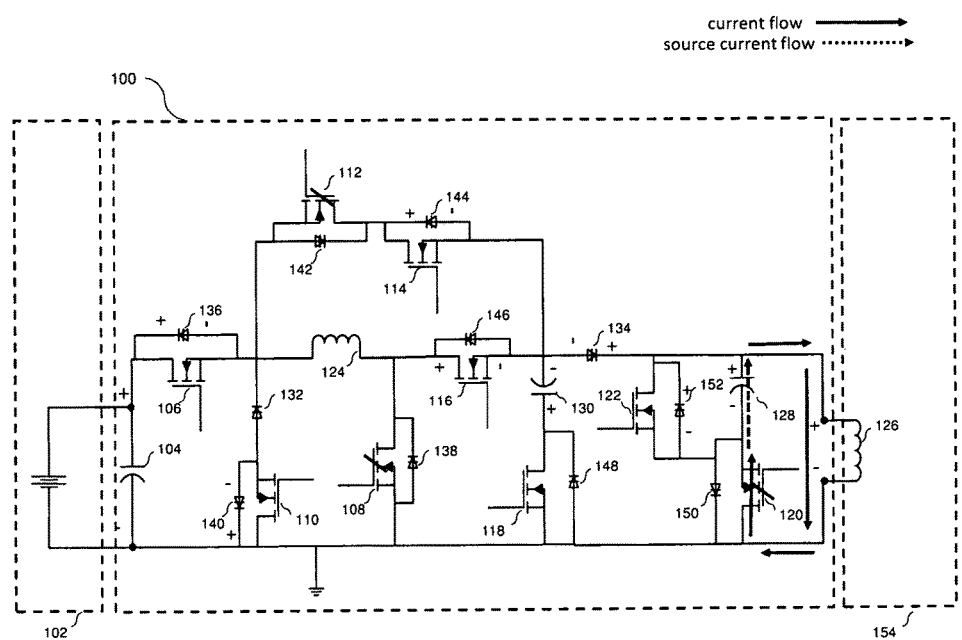
FIG. 8 illustrates a circuit diagram of the network of FIG. 1 in which the supply inductor current is zero and the load capacitor is providing energy to the load inductor in accordance with one embodiment of the invention.

FIG. 8 illustrates a circuit diagram of network 100 in which the current in supply inductor 124 reaches zero (0) amperes (A) and load capacitor 128 continues to discharge to load inductor 126. When current in supply inductor 124 reaches zero (0) amperes, as fifth switch 114 (S5) is open and reverse biased, the current is stopped from reversing through supply inductor 124. No switches change state to initiate this state.

Figure 9:
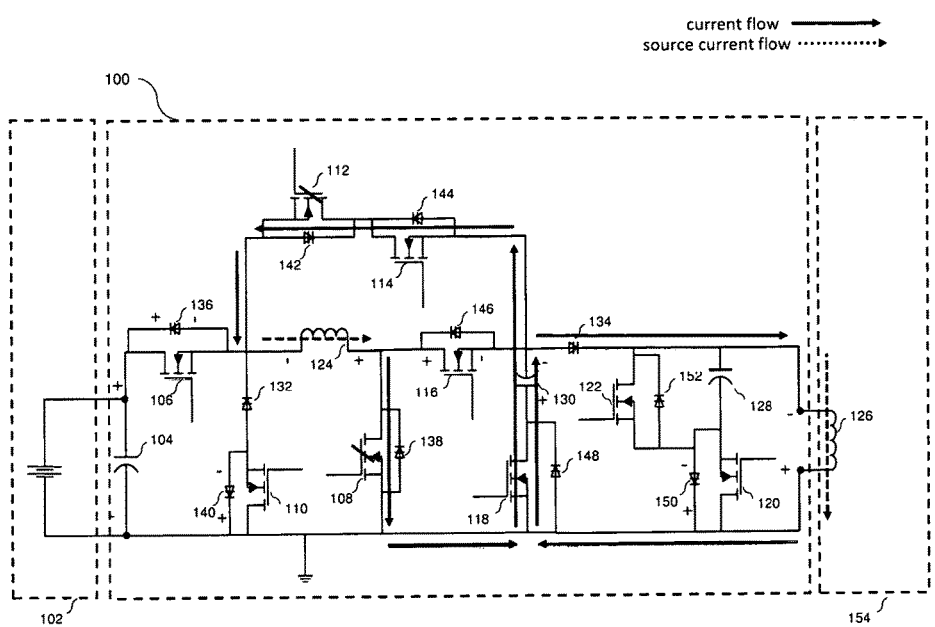
FIG. 9 illustrates a circuit diagram of the network of FIG. 1 in which the load capacitor voltage is zero with load inductor current being routed away from the load capacitor to the recovery capacitor while the supply inductor current is positive in accordance with one embodiment of the invention.

FIG. 9 illustrates a circuit diagram of network 100 in an optional state to that of FIG. 8 where reverse biasing of load capacitor 128 is not desired when load capacitor 128 reaches approximately zero (0) volts (V). In this alternate state, the current is routed away from load capacitor 128. To initiate the change to this alternate state, eighth switch 120 (S8) is opened. Supply inductor 124 discharges into recovery capacitor 130. The current flow is through second switch 108 (S2), which is closed, through seventh switch 118 (S7), which is forward biased, through fifth switch 114 (S5), which is forward biased, and through fourth switch 112 (S4), which is closed. Load inductor 126 discharges into recovery capacitor 130. Current flows through seventh switch 118

(S7), which is forward biased, and through second diode 134 (D2), which is forward biased.

Figure 10:
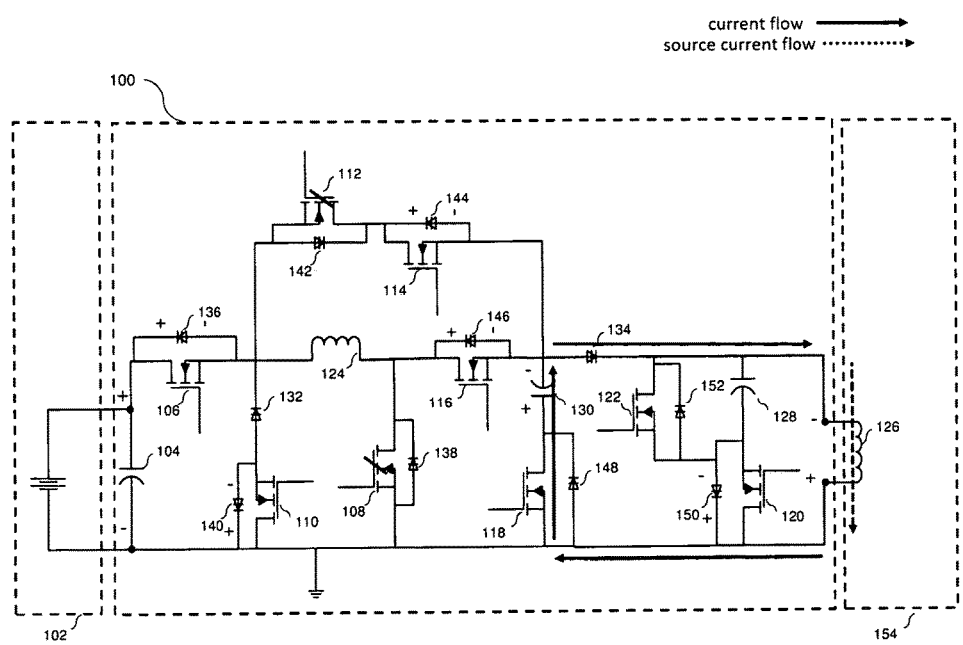
FIG. 10 illustrates a circuit diagram of the network of FIG. 1 in which the load capacitor voltage is zero and the supply inductor current is zero while load inductor current is routed to the recovery capacitor in accordance with one embodiment of the invention.

FIG. 10 illustrates a circuit diagram of network 100 which follows the state in either FIG. 8 or the state in FIG. 9. If network 100 entered the state shown in FIG. 8 before entering the state shown in FIG. 9, the network will move directly from the state in FIG. 8 to the state in FIG. 10 by opening eighth switch 120 (S8). In this state, load capacitor 128 has reached approximately zero (0) volts (V) and reverse biasing of load capacitor 128 is not desired, thus the current needs to be routed away from load capacitor 128. Load inductor 126 will discharge into recovery capacitor 130 by current flowing through seventh switch 118 (S7), which is forward biased, and through second diode 134 (D2), which is forward biased.

Alternatively, if the network entered the state shown in FIG. 9 before entering the state shown in FIG. 8, the network will move directly from the state in FIG. 9 to the state in FIG. 10 when fifth switch 114 (S5) reverse biases and current in supply inductor 124 reaches zero (0) amperes (A).

Figure 11:
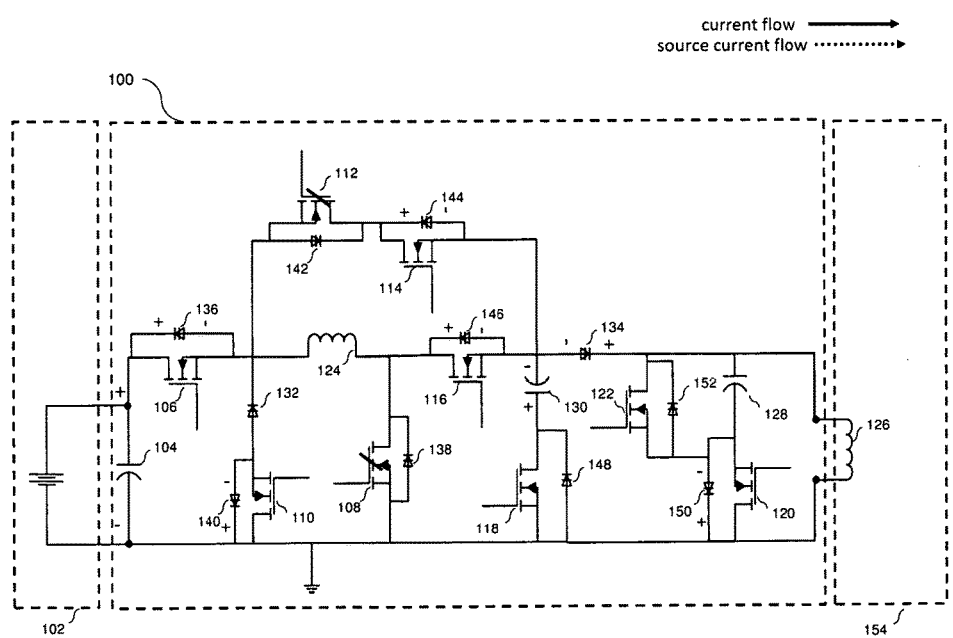
FIG. 11 illustrates a circuit diagram of the network of FIG. 1 in which the load inductor current is zero and the supply inductor current is zero in accordance with one embodiment of the invention.

FIG. 11 illustrates a circuit diagram of network 100 in which there is no current. The current in load inductor 126 has reached zero (0) amperes and second diode 134 (D2) is reverse biased. There is no change in the switch state from FIG. 10. This state is reached when the current in load inductor 126 reaches zero (0) amperes before the armature leaves railgun 154. When there is still current in the rails when the armature leaves railgun 154, an arc will develop between the rails of railgun 154 in series with load inductor 126 until the current through load inductor 126 drops to zero (0) amperes.

Figure 12:
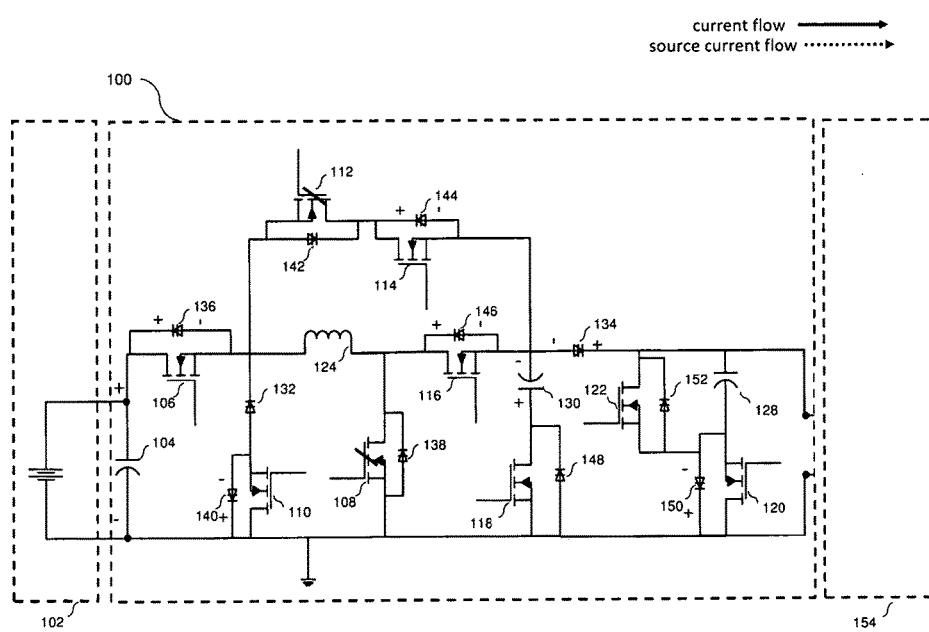
FIG. 12 illustrates a circuit diagram of the network of FIG. 1 in which the railgun armature has left the circuit in accordance with one embodiment of the invention.

FIG. 12 illustrates a circuit diagram of network 100 in which the armature has left the rails and any arc in the rails has dissipated. There is no change in the switch state from FIG. 11.

Figure 13:
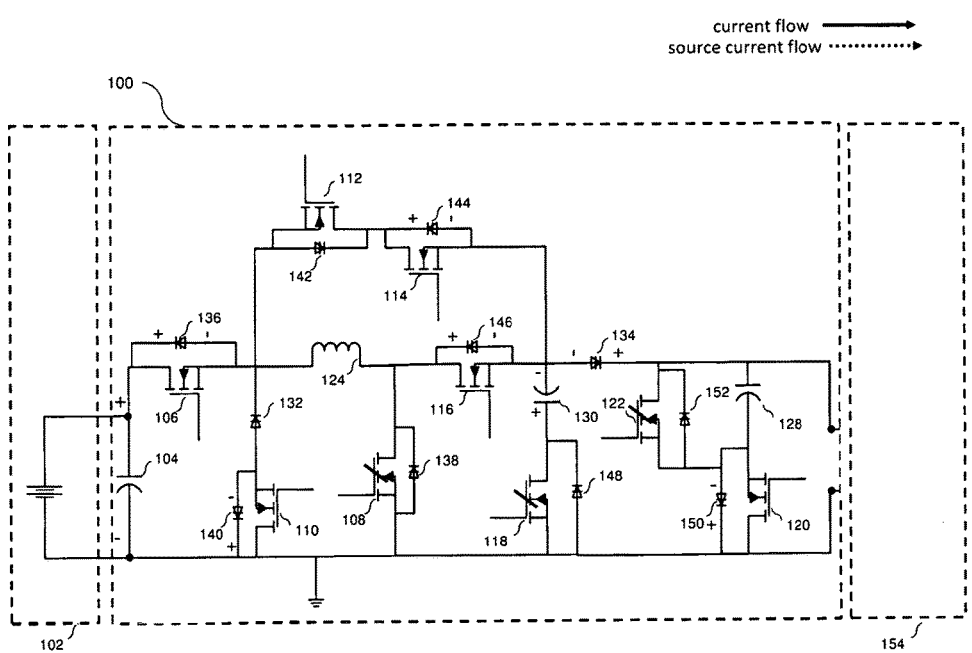
FIG. 13 illustrates a circuit diagram of the network of FIG. 1 in which the circuit switches are set to begin chargeback of the input capacitor from the recovery capacitor in accordance with one embodiment of the invention.

FIG. 13 illustrates a circuit diagram of network 100 in which circuit switches are set to prepare for chargeback to input capacitor 104. Once any arc has cleared the rails, recovery capacitor 130 can be discharged into supply inductor 124, which is then discharged back into input capacitor 104. To initiate this state, fourth switch 112 (S4) is opened and seventh switch 118 (S7) and ninth switch 122 (S9) are closed.

Figure 14:
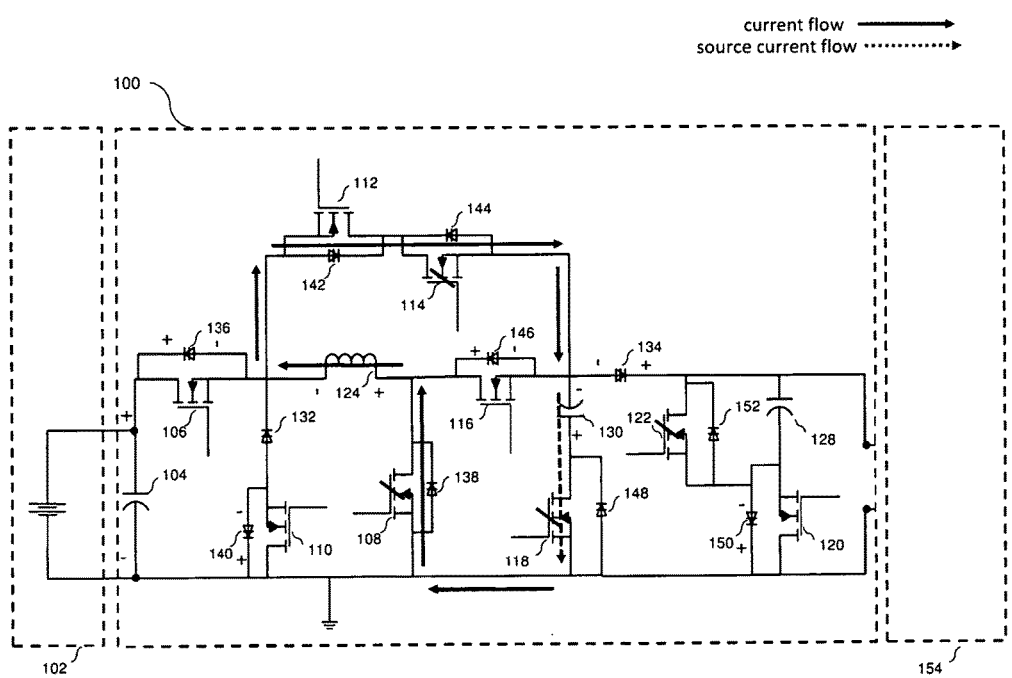
FIG. 14 illustrates a circuit diagram of the network of FIG. 1 in which the supply inductor is charged from energy stored in the recovery capacitor in accordance with one embodiment of the invention.

FIG. 14 illustrates a circuit diagram of network 100 in which supply inductor 124 is charged from energy stored in recovery capacitor 130. To initiate this state, fifth switch 114 (S5) is closed. The current path is through seventh switch 118 (S7), which is closed, through second switch 108 (S2), which is closed, through fourth switch 112 (S4), which is forward biased, and through fifth switch 114 (S5), which is now closed. In this state, supply inductor 124 is monitored to ensure current limits are not exceeded. If discharging all of the energy from recovery capacitor 130 into supply inductor 124 will cause too much current in the switches or in supply inductor 124, then fifth switch 114 (S5) can be opened to enter the state in FIG. 15.

Figure 15:
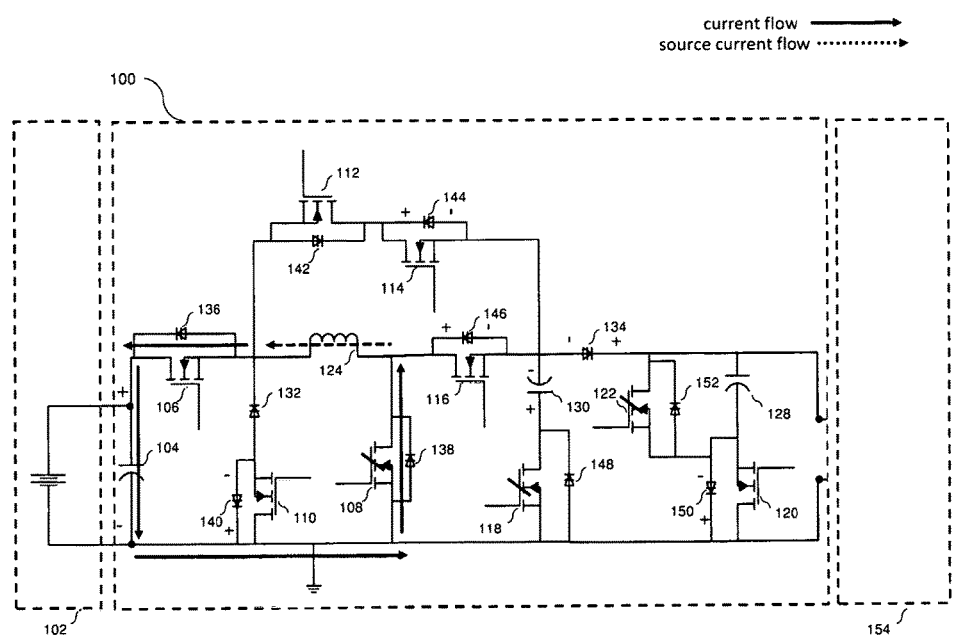
FIG. 15 illustrates a circuit diagram of the network of FIG. 1 in which the supply inductor is discharged to the input capacitor in accordance with one embodiment of the invention.

FIG. 15 illustrates a circuit diagram of network 100 in which supply inductor 124 discharges into input capacitor 104. To initiate this state, fifth switch 114 (S5) is opened. This will cause supply inductor 124 to develop a current back toward input capacitor 104. The current path is through first switch 106 (S1), which is forward biased, and second switch 108 (S2), which is closed. The current in supply inductor 124 is monitored to determine when the current is zero (0) amperes (A). Network 100 alternates between the states in FIGS. 14 and 15 until the voltage on recovery capacitor 130 is approximately zero (0) volts (V).

Figure 16:
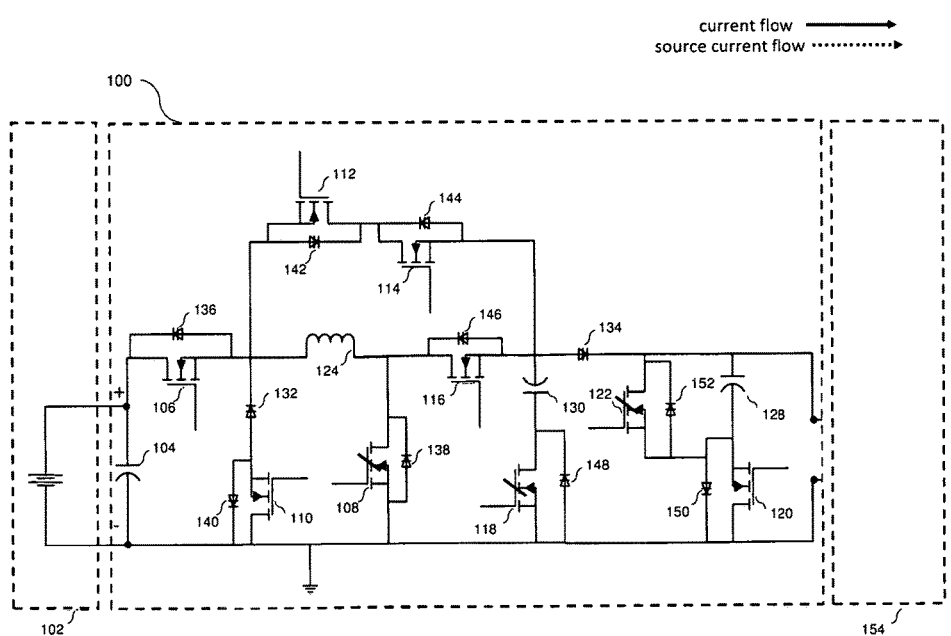
FIG. 16 illustrates a circuit diagram of the network of FIG. 1 in which the supply inductor current drops to zero and the recovery capacitor voltage is zero in accordance with one embodiment of the invention.

FIG. 16 illustrates a circuit diagram of network 100 in which supply inductor 124 and recovery capacitor 130 are fully discharged. The voltage in recovery capacitor 130 is zero (0) volts and the current in supply inductor 124 is zero (0) amperes (A). In this state, there is no current. This state is reached when the current in supply inductor 124 drops to zero (0) amperes (A) after the last time recovery capacitor 130 has charged it. First switch 106 (S1) is allowed to reverse bias to hold the voltage in input capacitor 104. There is no change is switch state.

Figure 17:
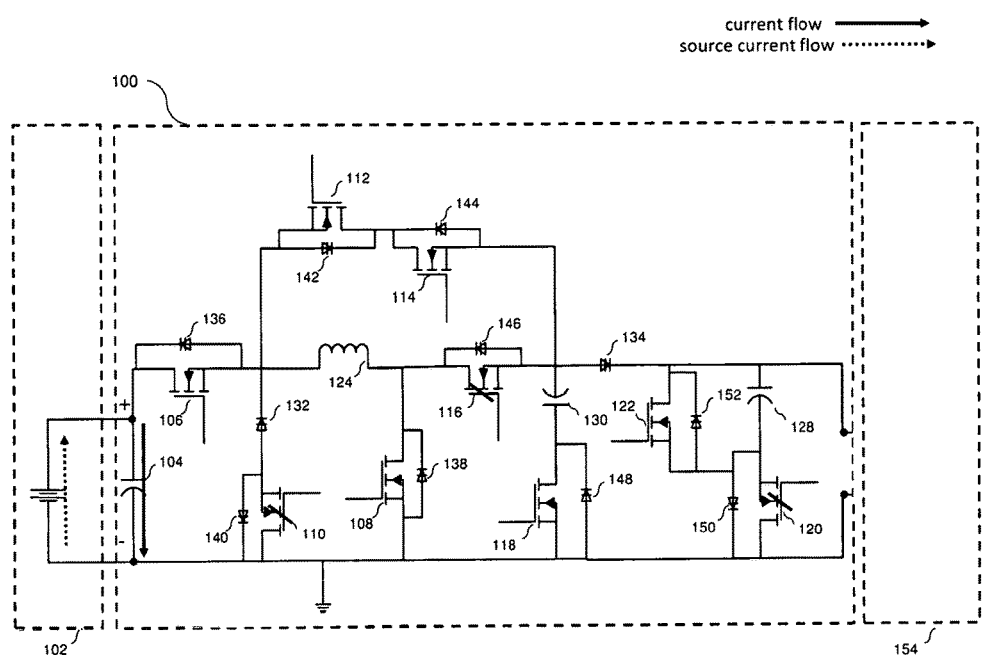
FIG. 17 illustrates a circuit diagram of the network of FIG. 1 in which the circuit is set ready to receive a new armature in the railgun, a charge to the input capacitor from outside of the circuit, and the switches are returned to the initial condition in FIG. 2 in accordance with one embodiment of the invention.

FIG. 17 illustrates a circuit diagram of network 100 in which network 100 is returned to an initial condition ready for armature reloading of railgun 154. To initiate this state, second switch 108 (S2), seventh switch 118 (S7) and ninth switch 122 (S9) are opened, and third switch 110 (S3), sixth switch 116 (S6) and eighth switch 120 (S8) are closed. Input capacitor 104 will be recharged from power source 102 and a new armature can be loaded into the rails of railgun 154 to begin another firing transient.

FIG. 18 shown in partial views FIGS. 18A, 18B, 18C, and 18D illustrates an example process flow diagram of a method 1800 for energy recovery in a pulse forming network utilizing network 100 implemented with a railgun in accordance with one embodiment of the invention. In one embodiment, method 1800 is implemented by controller 1900. Method 1800 is stored in memory 1904 and CPU 1902 implements the operations of method 1800. Method 1800 is described herein with continuing reference to FIGS. 1 through 21. As earlier described, the railgun load is represented in the circuit diagrams as load inductor 126.

Method 1800 includes a loading and pulse initiation process, operations 1802 and 1804, and following operation 1804, in one embodiment, a first process which powers firing of railgun 154 and the launch of the armature, is initiated simultaneously with a second process, which, at a specified point, will interrupt the first process and begin recovery of energy from the network for return to input capacitor 104. Herein operations 1806 through 1820, are referred to as the first process, and operations 1822 through 1862 are referred to as the second process. In one embodiment, operation 1806 and operation 1822, are initiated simultaneously following operation 1804, with operations 1806 through 1820 of the first process continuing until an interrupt is generated by the second process, at which time processing in the first process halts and processing continues to operation 1830 of the second process.

In one embodiment, the interrupt to operations 1806 through 1820 is generated by the second process when the input voltage (Vin) at input capacitor 104 drops below a specified minimum voltage value, or when the armature has moved past a specified location in the rail(s) of railgun 154. In one embodiment, the specified minimum voltage value is one percent (1%) of the initial input voltage. In one embodiment, the specified location in the rail(s) of railgun 154 is eighty percent (80%) of the rail length. When either of these two events occurs after operation 1804 is initiated, the active operation in the first process is halted by an interrupt generated by the second process, and processing continues to operation 1830 in the second process.

Figure 18A:
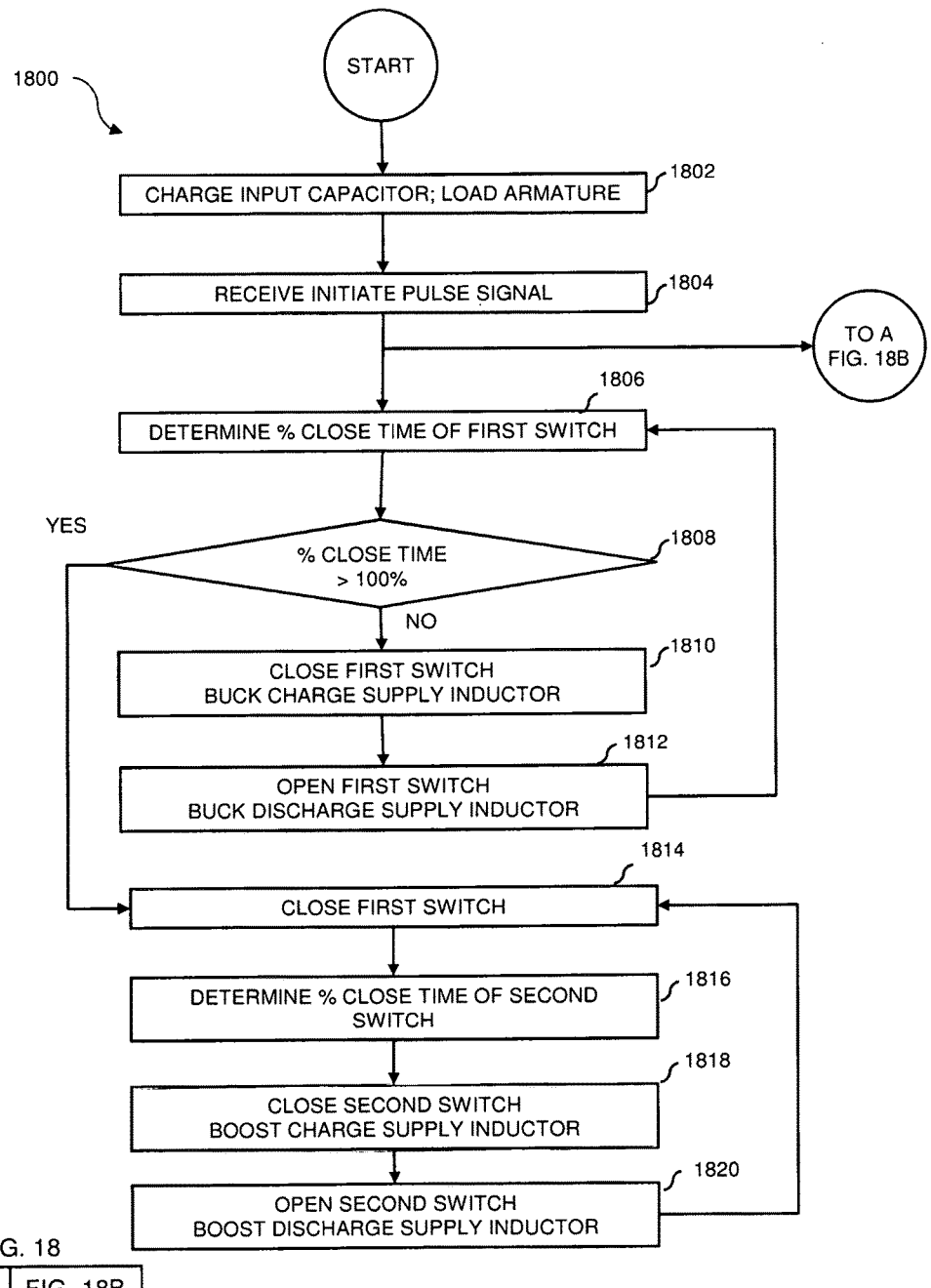
FIGS. 18A, 18B, 18C, and 18D illustrates an example process flow diagram for a method for energy recovery in a pulse forming network utilizing the energy recovery pulse forming network of FIG. 1 implemented with a railgun in accordance with one embodiment of the invention.
Figure 18A:
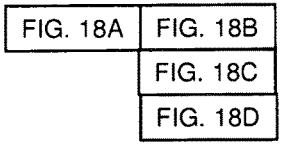

Referring now to FIG. 18A, in operation 1802, input capacitor 104 is charged from power source 102 and the armature and projectile are loaded in railgun 154. Network 100 is ready to begin a pulse to fire the armature and projectile. As discussed and shown with reference to FIG. 2, the initial switch settings of network 100 are first switch 106 (S1) open, second switch 108 (S2) open, third switch 110 (S3) closed, fourth switch 112 (S4) open, fifth switch 114

(S5) open, sixth switch 116 (S6) closed, seventh switch 118 (S7) open, eighth switch 120 (S8) closed, and ninth switch 122 (S9) open. Processing continues from operation 1802 to operation 1804.

In operation 1804, an operator input control signal to initiate a pulse in network 100 is received with processing continuing from operation 1804 to operation 1806.

In operation 1806, the percentage of time that first switch 106 (S1) should be closed during a next time step is determined. In one embodiment of the invention, a time step is 50 milliseconds (ms), which corresponds to a logic decision frequency of 20 kilohertz (kHz). In other embodiments, a time step can be set within a range at or about 100 milliseconds (ms), corresponding to a logic decision frequency of 10 kilohertz (kHz), down to 10 milliseconds (ms), corresponding to a logic decision frequency of 100 kilohertz (kHz). In still other embodiments the time step can be set faster than the above range.

The percentage of time that first switch 106 (S1) should be closed during the next time step is determined through calculations based on measurements of the input voltage (Vin) at input capacitor 104, the output voltage (Vout) across railgun 154, the current from input capacitor 104 into first switch 106, the current through supply inductor 124, the current provided by network 100 to inductor 126, and the current in railgun 154.

Figure 20:
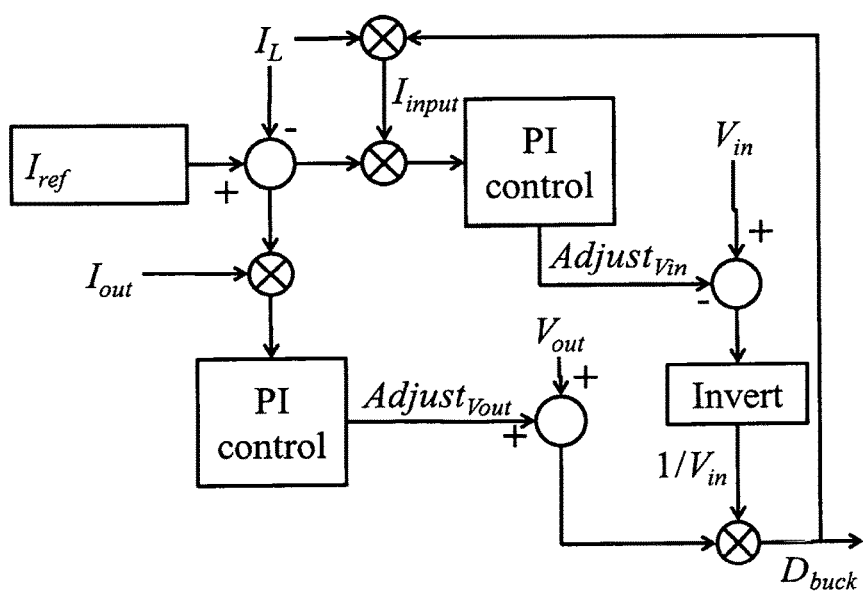
FIG. 20 illustrates a control block diagram of a $D_{buck}$ controller in accordance with one embodiment of the invention.

In one embodiment, the percentage of time that first switch 106 should be closed during the next time step is calculated by the equation $$D_{buck} = \frac{V_{out,target} + I_{out}Z_{out}}{V_{in} - I_{in}Z_{in}},$$

where $D_{buck}$ is the percentage of time that first switch 106 should be closed during the next time step, $V_{out,target}$ is the output voltage target value, $I_{out}$ is the current provided by network 100 to inductor 126, $Z_{out}$ is an estimate of the output impedance of network 100, $V_{in}$ is the input voltage at input capacitor 104, $I_{in}$ is the current from input capacitor 104 into first switch 106, and $Z_{in}$ is an estimate of the input impedance of network 100. $Z_{out}$ and $Z_{in}$ are calculated by separate proportional-integral controllers that drive the error between the current through supply inductor 124 and the target module current to 0. $V_{out,target}$ is calculated by a proportional error and a ramp driven by the error between the desired current in railgun 154 and the target current in railgun 154. In one embodiment, a $D_{buck}$ controller 2000 for determining $D_{buck}$ is shown in FIG. 20, and can be implemented in controller 1900. In other embodiments, different methods of determining the percentage of time that first switch 106 should be closed during the next time step may also be used. Processing continues from operation 1806 to decision block 1808.

In decision operation 1808, a determination is made based on the calculation of operation 1806. Upon a determination that the percentage of time that first switch 106 (S1) should be closed is calculated to be equal to 100% or greater ("YES"), processing continues from decision operation 1808 to operation 1814. Otherwise, upon a determination that the percentage of time that first switch 106 (S1) should be closed is calculated to be less than 100% ("NO"), processing continues from decision operation 1808 to operation 1810.

In operation 1810, input capacitor 104 is discharged with buck charging of supply inductor 124. As discussed and shown with reference to FIG. 3, first switch 106 (S1) is closed. Input capacitor 104 discharges into supply inductor 124, load inductor 126, and load capacitor 128. Upon reaching the end of the time determined by the control logic in operation 1806, processing continues from operation 1810 to operation 1812.

In operation 1812, supply inductor 124 is buck discharged. As discussed and shown with reference to FIG. 4, first switch 106 (S1) is opened. Supply inductor 124 discharges into load inductor 126 and load capacitor 128. Upon reaching the end of the time determined by the control logic in operation 1806, processing returns from operation 1812 to operation 1806.

Referring back again to decision operation 1808, alternatively, upon a determination that the percentage of time that first switch 106 (S1) should be closed is calculated to be equal to 100% or greater ("YES"), processing continues from decision operation 1808 to operation 1814. In operation 1814, first switch 106 (S1) is closed. Processing continues from operation 1814 to operation 1816.

In operation 1816, the percentage of time that second switch 108 (S2) should be closed during the next time step is determined. In one embodiment, the time steps for this calculation are the same as the time steps in operation 1806. In one embodiment, the percentage of time that second switch 108 (S2) should be closed during the next time step is determined through calculations based on measurements of the input voltage (Vin) at input capacitor 104, the output voltage (Vout) across railgun 154, the current from input capacitor 104 into first switch 106, the current provided by network 100 to inductor 126, and the current in railgun 154. In one embodiment, the percentage of time that second switch 108 should be closed during the next time step is calculated by the equation $$D_{boost} = \frac{(V_{out,target} + I_{out}Z_{out}) - (V_{in} - I_{in}Z_{in})}{V_{out,target} + I_{out}Z_{out}},$$

where $D_{boost}$ is the percentage of time that second switch 108 should be closed during the next time step, $V_{out,target}$ is the output voltage target value, $I_{out}$ is the current provided by network 100 to inductor 126, $Z_{out}$ is an estimate of the output impedance of network 100, $V_{in}$ is the input voltage at input capacitor 104, $I_{in}$ is the current from input capacitor 104 into first switch 106, and $Z_{in}$ is an estimate of the input impedance of network 100. $Z_{out}$ and $Z_{in}$ are calculated by separate proportional-integral controllers that drive the error between the current through supply inductor 124 and the target module current to 0. $V_{out,target}$ is calculated by a proportional error and a ramp driven by the error between the desired current in railgun 154 and the target current in railgun 154. In one embodiment, a $D_{boost}$ controller 2100 for determining $D_{boost}$ is shown in FIG. 21 and can be implemented in controller 1900. In other embodiments, different methods of determining the percentage of time that second switch 108 should be closed during the next time step may also be used. Processing continues from operation 1816 to operation 1818.

Together the above equations for calculating $D_{buck}$ and $D_{boost}$ improve the magnitude control and rise/fall time of the current pulse to meet the demands of a rising output voltage and a falling input voltage in network 100. The above equations for $D_{buck}$ and $D_{boost}$ and the $D_{buck}$ and $D_{boost}$ controllers illustrated in FIGS. 20 and 21 can also be applied to positive buck boost circuits to improve the magnitude control and rise/fall time of the current pulse where there is a changing output voltage and input voltage. An example of a positive buck boost circuit is presented in "A General Approach to Control a Positive Buck-Boost Converter to Achieve Robustness Against Input Voltage Fluctuations and Load Changes" by Boora, A., F. Zare, G. Ledwich, and A. Ghosh, Power Electronics Specialists Conference (PESC), 2008, IEEE, hereby incorporated by reference.

In operation 1818, supply inductor 124 is boost charged. As discussed and shown with reference to FIG. 5, second switch 108 (S2) is closed to initiate boost charging of supply inductor 124. Input capacitor 104 discharges into supply inductor 124. Load capacitor 128 discharges into load inductor 126. Upon reaching the end of the time determined by the control logic in operation 1816, processing continues from operation 1818 to operation 1820.

In operation 1820, supply inductor 124 is boost discharged. As discussed and shown with reference to FIG. 6, second switch 108 (S2) is opened to initiate boost discharging of supply inductor 124. Input capacitor 104 and supply inductor 124 discharge into load inductor 126 and load capacitor 128. Upon reaching the end of the time determined by the control logic in operation 1816, processing continues from operation 1820 to operation 1814.

Figure 18B:
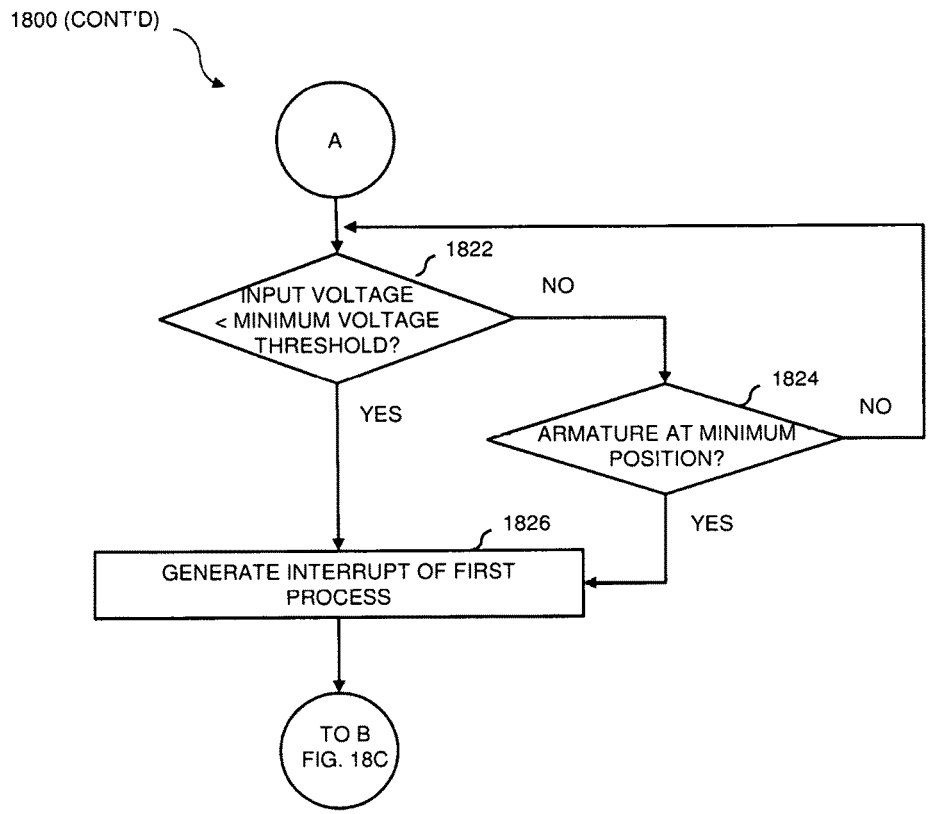

Referring now to FIG. 18B and the second process, as earlier described following operation 1804, the second process is initiated simultaneously in parallel with the first process. In one embodiment, the second process begins with an interrupt determination process illustrated as operations 1822 through 1826.

In decision operation 1822, a determination is made whether the input voltage (Vin) at input capacitor 104 is less than a specified minimum voltage value. In one embodiment, the specified minimum voltage value is one percent (1%) of the initial input voltage. Upon a determination that the input voltage (Vin) at input capacitor 104 is less than the specified minimum voltage value ("YES"), processing continues from decision operation 1822 to operation 1826.

Figure 18C:
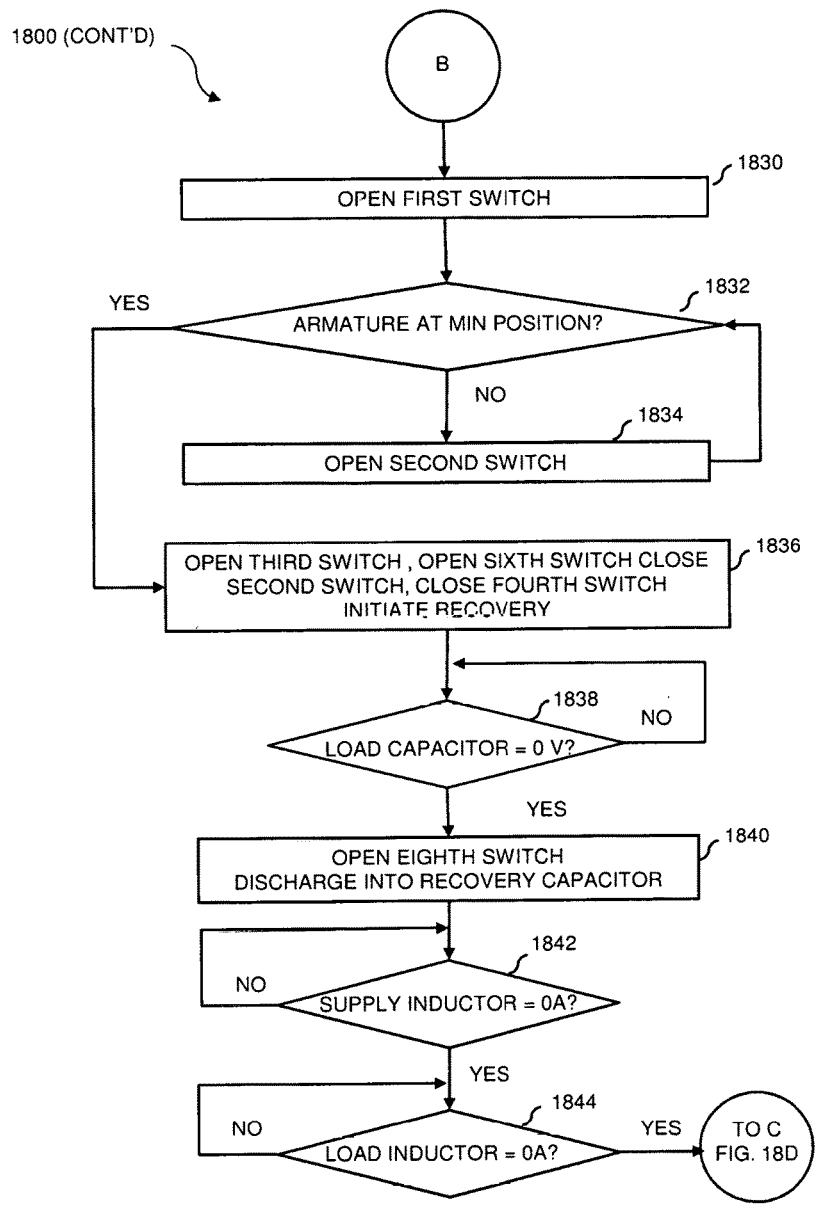

In operation 1826, an interrupt is generated and the first process is halted and processing continues from operation 1826 to operation 1830 (FIG. 18C).

Referring back again to decision operation 1822, alternatively, upon a determination that the input voltage (Vin) at input capacitor 102 is not less than the specified minimum voltage value ("NO"), processing continues from decision operation 1822 to decision operation 1824.

In decision operation 1824, a determination is made whether the armature has moved past a specified location in the rail(s) of railgun 154. In one embodiment, the specified location in the rail(s) of railgun 154 is eighty percent (80%) of the rail length. Upon a determination that the armature has not moved past the specified location in the rail(s) of railgun 154 ("NO"), processing returns from decision operation 1824 to operation 1822 with a next determination.

Referring back again to decision operation 1824, alternatively, upon a determination that the armature has moved past the specified location in the rail(s) of railgun 154 ("YES"), processing continues from decision operation 1824 to operation 1826 with generation of an interrupt which halts the first process, and processing continues from decision operation 1824 to operation 1830 (FIG. 18C).

Referring now to FIG. 18C, in operation 1830, first switch 106 (S1) is opened, if not already open. This will stop the flow of current from input capacitor 104 into the rest of network 100. Processing continues from operation 1830 to decision operation 1832.

In decision operation 1832, a determination is made whether the armature has moved past the specified location in the rail(s). As earlier described, in one embodiment, the specified location in the rail(s) of railgun 154 is eighty percent (80%) of the rail length. Upon a determination that the armature has moved past the specified location in the rail ("YES"), processing continues from decision operation 1832 to operation 1836. Otherwise, upon a determination that the armature has not moved past the specified location in the rail ("NO"), processing continues from decision operation 1832 to operation 1834.

In operation 1834, second switch 108 (S2) is opened (if not already open). Processing continues from operation 1834 to and returns to decision operation 1832 with a next determination. In some embodiments in which the armature does not move past the specified location within a specified amount of time, controller 1900 may include operations that alert the operator allowing the armature to be removed from the rails and/or the system manually reset.

Referring back again to decision operation 1832, alternatively, upon a determination that the armature has moved past the specified location in the rail(s) ("YES"), processing continues from decision operation 1832 to operation 1836. In operation 1836, recovery of energy is initiated with supply inductor 124 discharging to recovery capacitor 130 and load capacitor 128 discharging to load inductor 126. As discussed and shown with reference to FIG. 7, second switch 108 (S2) is closed, if not already closed, third switch 110 (S3) is opened, fourth switch 112 (S4) is closed, and sixth switch 116 (S6) is opened. From operation 1836, processing continues to decision operation 1838 in which it is determined when load capacitor 128 reaches zero (0) volts (V).

In decision operation 1838, a determination is made whether the voltage of load capacitor 128 reaches zero (0) volts (V). As earlier discussed with reference to FIGS. 8 and 9, network 100 can enter either state dependent on whether the supply inductor 124 reaches zero amperes (A) first (FIG. 8), or whether load capacitor 128 reaches zero volts (V) first (FIG. 9). The end result of these transients is that eventually load capacitor 128 will reach zero (0) volts (V). Upon a determination that the voltage of load capacitor 128 equals zero (0) volts (V) ("YES"), processing continues from decision operation 1838 to operation 1840. Otherwise, upon a determination that the voltage of load capacitor 128 does not equal zero (0) volts (V) ("NO"), processing returns to decision operation 1838 with a next determination.

In operation 1840, eighth switch 120 (S8) is opened to route the current to recovery capacitor 130. Processing continues from operation 1840 to decision operation 1842.

In decision operation 1842, a determination is made whether the current in supply inductor 124 equals zero (0) amperes (A). Upon a determination that the current in supply inductor 124 equals zero (0) amperes (A) ("YES"), processing continues from decision operation 1842 to decision operation 1844. Otherwise, upon a determination that the current in supply inductor 124 does not equal zero (0) amperes (A) ("NO"), processing returns to decision operation 1842 with a next determination.

In decision operation 1844, a determination is made whether the current in the load inductor 126 equals zero (0) amperes (A) with the armature having left the circuit and any arc dissipated. The current in supply inductor 124 has reached zero (0) amperes (A) and the voltage in load capacitor 128 is approximately zero (0) volts (V). This is the state shown in FIG. 10. The preferred order of events at this time is for the armature to leave the circuit resulting in a small arc across the rails until the current in the load inductor 126 is zero (0) amperes (A). The state of network 100 is shown with reference to either FIG. 11 or FIG. 12 depending on whether the armature has left the circuit. Upon a determination that the current in the load inductor 126 does not equal zero (0) amperes (A) ("NO"), processing returns to the start of decision operation 1844 with a next determination. Otherwise, upon a determination that the current in the load inductor 126 is equal to zero (0) amperes (A) ("YES"), processing continues from decision operation 1844 to operation 1846 (FIG. 18D) to prepare for chargeback.

Figure 18D:
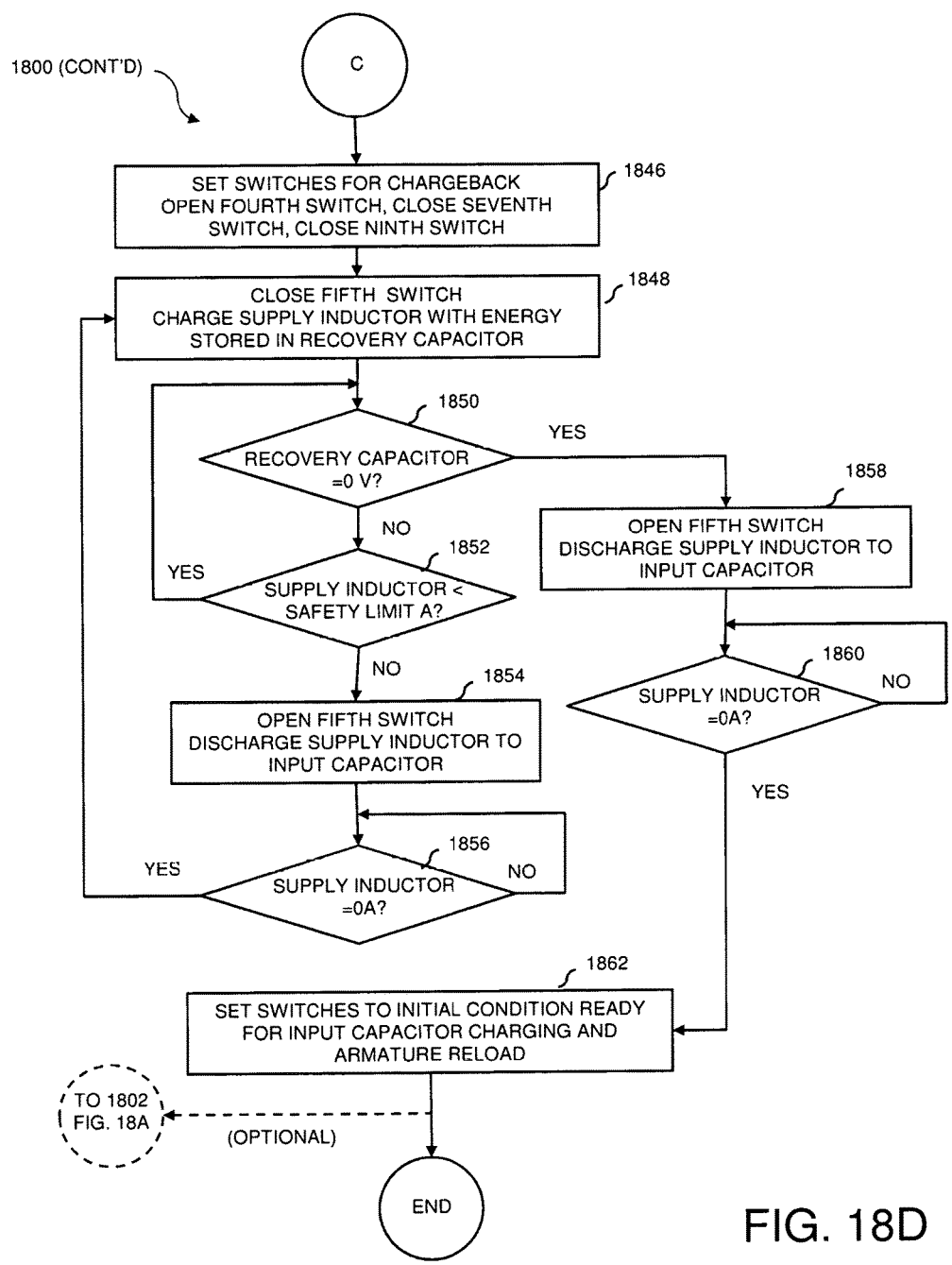
Figure 19:
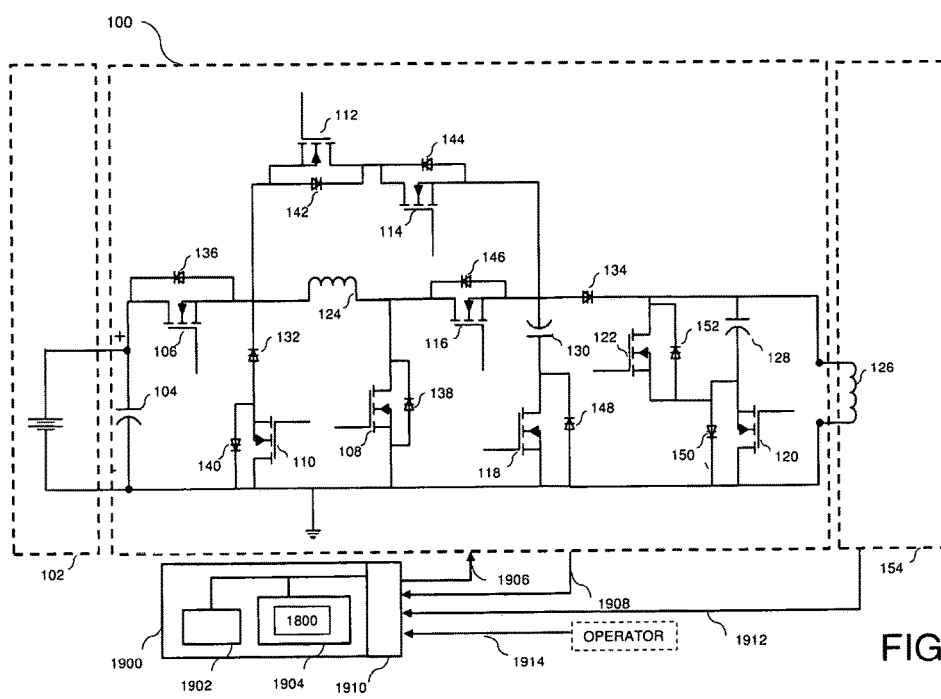
FIG. 19 illustrates a circuit diagram of the network of FIG. 1 with a computer controller including the method of FIG. 18 in accordance with one embodiment of the invention.

Referring now to FIG. 18D, in operation 1846, the circuit switches in network 100 are set to prepare for chargeback to input capacitor 104. As discussed and shown with reference to FIG. 13, fourth switch 112 (S4) is opened and seventh switch 118 (S7) and ninth switch 122 (S9) are closed. Processing continues from operation 1846 to operation 1848.

In operation 1848, supply inductor 124 is charged from energy stored in recovery capacitor 130. As discussed and shown with reference to FIG. 14, fifth switch 114 (S5) is closed and recovery capacitor 130 is discharged into supply inductor 124. Voltage is applied across supply inductor 124 from recovery capacitor 130. In this operation, supply inductor 124 is monitored to ensure current limits are not exceeded. Processing continues from operation 1848 to decision operation 1850.

In decision operation 1850, a determination is made whether the voltage of recovery capacitor 130 is equal to zero (0) volts (V). Upon a determination that the voltage of recovery capacitor 130 is not equal to zero (0) volts (V), i.e., is greater than zero (0) volts (V) ("NO"), processing continues to decision operation 1852. Otherwise, upon a determination that the voltage of recovery capacitor 130 equals zero (0) volts (V) ("YES"), processing continues from decision operation 1850 to operation 1858.

In decision operation 1852, the current in supply inductor 124 is compared to a specified current safety limit to determine whether it is less than the specified current safety limit. Upon a determination that the current in supply inductor 124 is less than the specified current safety limit ("YES"), processing returns to the start of decision operation 1850 with a next determination. Otherwise upon a determination that the current in supply inductor 124 is not less than the specified current safety limit ("NO"), processing continues from decision operation 1852 to operation 1854.

In operation 1854, supply inductor 124 is discharged to input capacitor 104 while there is still energy in recovery capacitor 130. As discussed and shown with reference to FIG. 15, fifth switch 114 (S5) is opened and supply inductor 124 discharges into input capacitor 104. Opening fifth switch 114 (S5) causes supply inductor 124 to develop a current back toward input capacitor 104. Processing continues from operation 1854 to decision operation 1856.

In decision operation 1856, a determination is made whether the current in supply inductor 124 is equal to zero (0) amperes (A). Upon a determination that the current in supply inductor 124 is equal to zero (0) amperes (A) ("YES"), processing returns to operation 1848. Otherwise, upon a determination that the current in supply inductor 124 is not equal to zero (0) amperes (A) ("NO"), processing returns to the start of decision operation 1856.

Referring back again to decision operation 1850, alternatively, upon a determination that the voltage of recovery capacitor 130 equals zero (0) volts (V) ("YES") processing continues to operation 1858. In operation 1858, supply inductor 124 is discharged to input capacitor 104 while there is no energy in recovery capacitor 130. As discussed and shown with reference to FIG. 15, fifth switch 114 (S5) is opened and supply inductor 124 discharges into input capacitor 104. Opening fifth switch 114 (S5) causes supply inductor 124 to develop a current back toward input capacitor 104. Processing continues from operation 1858 to decision operation 1860.

In decision operation 1860, a determination is made whether the current in supply inductor 124 is zero (0) amperes (A). Upon a determination that the current in supply inductor 124 is not zero (0) amperes (A) ("NO"), processing returns to the start of decision operation 1860 with a next determination. Otherwise, upon a determination that the current in supply inductor 124 is zero (0) amperes (A) ("YES"), processing continues from decision operation 1860 to operation 1862.

In operation 1862, network 100 is returned to an initial condition ready for charging of input capacitor 104 and armature reloading. As discussed and shown with reference to FIG. 17, second switch 108 (S2), seventh switch 118 (S7), and ninth switch 122 (S9) are opened and third switch 110 (S3), sixth switch 116 (S6), and eighth switch 120 (S8) are closed. Network 100 is returned to an initial condition ready for charging of input capacitor 104 and armature loading of railgun 154. From operation 1862, processing exits method 1800 or, optionally, processing returns to operation 1802 (FIG. 18A) where input capacitor 104 is recharged from external source 102 and a new armature and projectile are loaded into railgun 154.

This disclosure provides exemplary embodiments of the present invention. The scope of the present invention is not limited by these exemplary embodiments. Numerous variations, whether explicitly provided for by the specification or implied by the specification or not, may be implemented by one of skill in the art in view of this disclosure.

What is claimed is:

1. An energy recovery pulse forming network comprising:
    an input capacitor, said input capacitor connectable to and chargeable by a power supply, said input capacitor for storing energy for transfer to a supply inductor;
    a first switch coupled in series with said input capacitor to form a first series combination;
    a first diode coupled in series with a third switch to form a second series combination;
    wherein said first series combination is coupled in parallel with said second series combination to form a first series-parallel combination;
    a ninth switch coupled in parallel with a load capacitor to form a first parallel combination;
    an eighth switch coupled in series with said first parallel combination to form a second series-parallel combination;
    a load coupled in parallel with said second series-parallel combination to form a third series-parallel combination;
    a second diode coupled in series with said third series-parallel combination to form a fourth series parallel combination;
    a seventh switch coupled in series to a recovery capacitor to form a third series combination;
    wherein said third series combination is coupled in parallel with said fourth series-parallel combination to form a fifth series-parallel combination;
    a fifth switch coupled in series with a fourth switch to form a fourth series combination; and,
    said supply inductor, a sixth switch, and a second switch connected in wye to form a first wye formation;

wherein said first series-parallel combination, said fifth series-parallel combination, and said fourth series combination are connected in delta around said first wye formation to form a first delta formation; and further wherein a junction between said first series-parallel combination and said fifth series-parallel combination connects at a node for said second switch from said first wye formation, a junction between said fifth series-parallel combination and said fourth series combination connects at a node for said sixth switch from said first wye formation, and a junction between said fourth series combination and said first series-parallel combination connects at a node for said supply inductor from said first wye formation.

2. The energy recovery pulse forming network of claim 1, further comprising:
a third diode coupled in parallel with said first switch;
a fourth diode coupled in parallel with said second switch;
a fifth diode coupled in parallel with said third switch;
a sixth diode coupled in parallel with said fourth switch;
a seventh diode coupled in parallel with said fifth switch;
an eighth diode coupled in parallel with said sixth switch;
a ninth diode coupled in parallel with said seventh switch;
a tenth diode coupled in parallel with said eighth switch; and,
an eleventh diode coupled in parallel with said ninth switch.

3. The energy recovery pulse forming network of claim 1, wherein said load comprises:
a railgun load having a load inductance.

4. The energy recovery pulse forming network of claim 2, wherein, in operation, said network is arranged to return at least a portion of energy stored in said load inductance to said input capacitor.

5. An energy recovery pulse forming network comprising:
an input capacitor, said input capacitor connectable to and chargeable by said power supply, said input capacitor for storing energy for transfer to a supply inductor;
a first switch coupled in series with said input capacitor and further coupled in series with said supply inductor;
said supply inductor coupled in series with said first switch and further coupled in series with a sixth switch;
said sixth switch coupled in series with said supply inductor and further coupled in series with a second diode;
a second diode coupled in series with said sixth switch and further connectable to a load;
said load coupled in series with said second diode and further coupled in series with said input capacitor;
a third switch coupled in parallel with said input capacitor at a point between said load and said input capacitor and further coupled to a first diode;
said first diode coupled in series with said third switch and at a point between said first switch and said supply inductor;
a second switch coupled in parallel with said third switch at a point between said load and said third switch and further coupled at a point between said supply inductor and said sixth switch;
a seventh switch coupled in parallel with said second switch at a point between said load and said second switch and further coupled in series to a recovery capacitor;

said recovery capacitor coupled in series to said seventh switch and further coupled at a point between said sixth switch and said second diode;
an eighth switch coupled in parallel with said seventh switch at a point between said load and said seventh switch and further coupled in series to a load capacitor and in series to a ninth switch;
said load capacitor coupled in series with said eighth switch and further coupled at a point between said ninth switch and said load;
said ninth switch coupled in series with said eighth switch and in parallel with said load capacitor at a point between said eighth switch and said load capacitor and further coupled at a point between said second diode and said load;
a fifth switch coupled in series with said recovery capacitor at a point between said sixth switch and said second diode and further coupled to a fourth switch; and,
said fourth switch coupled in series with said fifth switch and coupled in series to said first diode at a point between said first switch and said supply inductor,
wherein said fifth switch and said fourth switch are in parallel with said supply inductor and said sixth switch.

6. The energy recovery pulse forming network of claim 5, further comprising:
a third diode coupled in parallel with said first switch;
a fourth diode coupled in parallel with said second switch;
a fifth diode coupled in parallel with said third switch;
a sixth diode coupled in parallel with said fourth switch;
a seventh diode coupled in parallel with said fifth switch;
an eighth diode coupled in parallel with said sixth switch;
a ninth diode coupled in parallel with said seventh switch;
a tenth diode coupled in parallel with said eighth switch; and,
an eleventh diode coupled in parallel with said ninth switch.

7. The energy recovery pulse forming network of claim 6, wherein said load comprises a railgun load comprising:
a load inductance.

8. The energy recovery pulse forming network of claim 7, wherein, in operation, said network is arranged to return at least a portion of the energy stored in said load inductance to said input capacitor.

9. The energy recovery pulse forming network of claim 8, further comprising:
a controller, said controller connected to said energy recovery pulse forming network to control the opening and closing of said first switch, said second switch, said third switch, said fourth switch, said fifth switch, said sixth switch, said seventh switch, said eighth switch, and said ninth switch;
one or more control lines connected to said controller and to one or more locations in said energy recovery pulse forming network;
one or more network sensor lines connected to said controller and to one or more network sensors connected to said energy recovery pulse forming network; and
one or more railgun sensor lines connected to said controller and to one or more railgun sensors connected to said railgun.

10. The energy recovery pulse forming network of claim 9, wherein said controller further comprises:
a processor;

a memory connected to said processor, said memory including a method for energy recovery in a pulse forming network; and an interface connected to said one or more control lines, said one or more network sensor lines, and said one or more railgun sensor lines.

11. A method for energy recovery in a pulse forming network comprising:

obtaining a railgun including conductive rail(s) loaded with a conductive armature having a projectile, said railgun conductively coupled with an energy recovery pulse forming network for powering said railgun and launching said armature out a muzzle end of said railgun;

charging an input capacitor of said energy recovery pulse forming network from a power supply;

receiving an pulse initiation signal;

initiating a first process, said first process powering said energy recovery pulse forming network with energy from said input capacitor, said energy recovery pulse forming network further powering said railgun and moving said armature down said rail(s) and out said muzzle end of said railgun, said first process comprising:

determining a percentage close time of a first switch that permits buck charging and buck discharging of a supply inductor in said network, and when said percentage close time of said first switch is determined to be greater than 100%, closing said first switch and determining a percentage close time of a second switch that permits boost charging and boost discharging of said supply inductor, wherein said determining a percentage close time of a first switch comprises:

calculating $$D_{buck} = \frac{V_{out,target} + I_{out}Z_{out}}{V_{in} - I_{in}Z_{in}};$$

wherein $D_{buck}$ is a percentage of time that said first switch should be closed during a next time step, $V_{out,target}$ is an output voltage target value, $I_{out}$ is a current provided by said network to inductor 126, $Z_{out}$ is an estimate of an output impedance of said network, $V_{in}$ is an input voltage at said input capacitor, $I_{in}$ is a current from said input capacitor into said first switch, and $Z_{in}$ is an estimate of an input impedance of said network;

wherein, $Z_{out}$ and $Z_{in}$ are calculated by separate proportional-integral controllers that drive an error between a current through said supply inductor and a target module current to 0; and, wherein $V_{out,target}$ is calculated by a proportional error and a ramp driven by an error between a desired current in said railgun and a target current in said railgun, and further wherein said determining a percentage close time of a second switch comprises:

calculating $$D_{boost} = \frac{(V_{out,target} + I_{out}Z_{out}) - (V_{in} - I_{in}Z_{in})}{V_{out,target} + I_{out}Z_{out}};$$

wherein $D_{boost}$ is the percentage of time that said second switch should be closed during a next time step, $V_{out,target}$ is an output voltage target value, $I_{out}$ is a current provided by said network to inductor 126, $Z_{out}$ is an estimate of the output impedance of said network, $V_{in}$ is an input voltage at said input capacitor, $I_{in}$ is a current from said input capacitor into said first switch, and $Z_{in}$ is an estimate of an input impedance of said network;

wherein $Z_{out}$ and $Z_{in}$ are calculated by separate proportional-integral controllers that drive the error between the current through said supply inductor and a target module current to 0; and wherein $V_{out,target}$ is calculated by a proportional error and a ramp driven by an error between a desired current in said railgun and said target current in said railgun; and initiating a second process, said second process interrupting said first process on the occurrence of an interrupt event and transferring energy dissipated from a railgun inductance of said railgun back to said input capacitor.

12. The method of claim 11, wherein said first process and said second process are initiated simultaneously.

13. The method of claim 11, wherein said interrupt event occurs when an input voltage (Vin) at said input capacitor is less than a specified minimum voltage value.

14. The method of claim 13, wherein said specified minimum voltage value is one percent (1%) of the initial input voltage.

15. The method of claim 11, wherein said interrupt event occurs when said armature has moved past a specified location in said rail(s) of said railgun.

16. The method of claim 15, wherein said specified location is eighty percent (80%) of the rail length.

* * * * *